(12) United States Patent
Oh

(10) Patent No.: US 7,541,212 B2
(45) Date of Patent: Jun. 2, 2009

(54) IMAGE SENSOR INCLUDING AN ANTI-REFLECTION PATTERN AND METHOD OF MANUFACTURING THE SAME

(75) Inventor: Tae-Seok Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 70 days.

(21) Appl. No.: 11/377,485

(22) Filed: Mar. 16, 2006

(65) Prior Publication Data

US 2006/0220025 A1  Oct. 5, 2006

(30) Foreign Application Priority Data

Mar. 30, 2005  (KR)  .................... 10-2005-0026274

(51) Int. Cl.
*H01L 23/58* (2006.01)
*H01L 29/04* (2006.01)

(52) U.S. Cl. .......................... 438/48; 438/70

(58) Field of Classification Search ............... 438/22, 438/24, 48, 70; 257/E27.132, E27.133
See application file for complete search history.

(56) References Cited

U.S. PATENT DOCUMENTS 7,009,226 B1 *  3/2006  Sun ........................... 257/192
7,081,647 B2 *  7/2006  Mushika ..................... 438/48
7,288,424 B2 * 10/2007  Hunter et al. ............... 438/48
2004/0140564 A1 *  7/2004  Lee et al. .................... 257/758

FOREIGN PATENT DOCUMENTS

| JP | 2004 207433 | 7/2004 |
|---|---|---|
| JP | 2004 221532 | 8/2004 |
| KR | 2003 0044330 | 6/2003 |

OTHER PUBLICATIONS

English Abstract for Publication No. 1020030044330.
English Abstract for Publication No. 2004-207433.
English Abstract for Publication No. 2004-221532.

* cited by examiner

*Primary Examiner*—Hung Vu
(74) *Attorney, Agent, or Firm*—F. Chau & Associates, LLC

(57) ABSTRACT

An image sensor comprises a substrate including a photodiode, and an insulation pattern structure making contact with the photodiode on the substrate. An anti-reflection pattern is formed on the insulation pattern structure and the substrate. The anti-reflection pattern includes a first opening through which the insulation pattern structure is exposed corresponding to the photodiode. A first insulation interlayer structure is formed on the anti-reflection pattern, and the first insulation interlayer structure includes at least one insulation layer and a second opening connected to the first opening. A metal wiring structure is formed in the insulation layer, and a transparent insulation pattern is formed in the first and second openings. A color filter is formed on the transparent insulation pattern, and a micro lens is formed on the color filter.

9 Claims, 17 Drawing Sheets

IMAGE SENSOR INCLUDING AN ANTI-REFLECTION PATTERN AND METHOD OF MANUFACTURING THE SAME

CROSS-REFERENCE TO RELATED PATENT APPLICATIONS

This application claims priority to Korean Patent Application No. 2005-26274, filed on Mar. 30, 2005, the content of which is herein incorporated by reference in its entirety.

BACKGROUND OF THE INVENTION

1. Technical Field

The present invention relates to an image sensor and a method of manufacturing the same and, more particularly, to a complementary metal oxide semiconductor (CMOS) image sensor and a method of manufacturing the same.

2. Description of the Related Art

Image sensors, which transform optical images into electric signals, are generally classified into a charge coupled device (CCD) image sensor type and a CMOS image sensor type. The CCD image sensor includes a plurality of MOS capacitors for transferring free electrons created by incident photons, and the CMOS image sensor includes a plurality of unit pixels and electric circuits for controlling the unit pixels.

The CCD image sensor has high power consumption, a complicated manufacturing process and a complex operating mode. Generally, signal processing circuits are difficult to fabricate in one CCD chip. In contrast, the CMOS image sensor is relatively easy to manufacture. Recent research on the image sensors has been intensively focused on the CMOS image sensor.

The CMOS image sensor includes a pixel area in which an image is captured and a logic area for controlling output signals generated from the pixel area. The pixel area includes a photodiode and a MOS transistor and the logic area includes a plurality of MOS transistors.

The pixel area and the logic area may be stacked on a substrate, and the transistors in the pixel area and the logic area may be formed together.

To manufacture the CMOS image sensor, the photodiode is formed on a substrate and then the MOS transistor is formed on the substrate in the pixel area. A silicon nitride layer is formed on the photodiode and the CMOS transistor and is partially removed to form a gate spacer on a sidewall of a gate electrode of the MOS transistor. The silicon nitride layer remains on the photodiode after the spacer is formed. Then, an anti-reflection layer is formed on the silicon nitride layer and is partially removed to expose the photodiode. The anti-reflection layer prevents a diffused reflection from the spacer in a subsequent process.

Forming the spacer and the anti-reflection pattern typically require several photolithography processes. For example, a first photoresist pattern is formed on the silicon nitride layer through a first photolithography process, such that the photodiode portion is covered with the photoresist and the CMOS transistor portion is exposed. The silicon nitride layer is anisotropically etched using the first photoresist pattern as an etching mask, thereby forming a gate spacer on the sidewall of the gate electrode of the MOS transistor. A second photoresist pattern is formed on the anti-refection layer through a second photolithography process, such that the photodiode portion is exposed and the CMOS transistor portion is covered with the photoresist. The anti-reflection layer is partially etched using the second photoresist pattern as an etching mask, thereby forming an anti-reflection pattern on the silicon nitride layer.

As the density of pixels of a CMOS image sensors increase, there is a tendency for an electric signal generated from a first pixel area to be influenced by another electric signal generated from a second pixel area adjacent to the first pixel area, thereby deteriorating image quality. This is known as pixel crosstalk. The pixel crosstalk is high when the photons falling on one pixel are "falsely" sensed by other pixels around it. Metal wiring is formed into a multilayer structure in the image sensor such that an optical path incident to each pixel becomes longer and reduces the photosensitivity of the pixel area of the image sensor.

SUMMARY OF THE INVENTION

Exemplary embodiments of the present invention provide a CMOS image sensor and a method of manufacturing the above-mentioned image sensor.

According to an exemplary embodiment of the present invention, an image sensor comprises a substrate including a photodiode, and an insulation pattern structure making contact with the photodiode on the substrate. An anti-reflection pattern is provided on the insulation pattern structure and on the substrate. The anti-reflection pattern includes a first opening through which the insulation pattern structure is exposed corresponding to the photodiode. A first insulation interlayer structure is provided on the anti-reflection pattern, and the first insulation interlayer structure includes at least one insulation layer and a second opening connected to the first opening. A metal wiring structure is provided in the insulation layer of the first insulation interlayer structure, and a transparent insulation pattern is formed in the first and second openings. A color filter is provided on the transparent insulation pattern, and a micro lens is provided on the color filter.

The anti-refection layer may comprise silicon oxynitride or silicon nitride. The insulation pattern structure may include a silicon oxide pattern and a silicon nitride pattern sequentially stacked on the substrate. The silicon nitride pattern corresponding to the photodiode may be formed to a thickness of about 400 Å. The image sensor may further comprise a transistor formed on the substrate, the transistor including a spacer on a sidewall of a gate electrode.

In an exemplary embodiment of the present invention, an image sensor comprises a substrate on which a first area and a second area are defined, wherein a photodiode is formed in the first area of the substrate, and an insulation pattern structure making contact with the photodiode in the first area of the substrate. An anti-reflection pattern is provided on the insulation pattern structure and the substrate. The anti-reflection pattern includes a first opening through which the insulation pattern structure is exposed corresponding to the photodiode. A first insulation interlayer structure is provided on the anti-reflection pattern in the first area of the substrate, and the first insulation interlayer structure includes at least one insulation layer and a second opening connected to the first opening. A first metal wiring structure is provided in the insulation layer of the first insulation interlayer structure, and a transparent insulation pattern is formed in the first and second openings. A second insulation interlayer structure is provided on the anti-reflection pattern in the second area of the substrate. The first insulation interlayer structure includes at least one insulation layer, wherein a top surface of the second insulation interlayer structure is above that of the first insulation interlayer structure. A second metal wiring structure is provided in the insulation layer of the second insulation interlayer structure, wherein a top surface of the second metal wiring structure is above that of the first metal wiring structure. A color filter is provided on the transparent insulation pattern, and a micro lens is provided on the color filter.

The first area may include an active pixel area in which pixels are arranged and the second area may include a peripheral area in circuits are formed. The transparent insulation pattern may have a refractive index higher than that of the insulation layer of the first insulation interlayer structure. The image sensor may further include a transistor formed on the substrate, and the transistor may include a spacer formed on a sidewall of a gate electrode thereof. The image sensor may further include a lower insulation layer formed on the anti-reflection layer, and the lower insulation layer may cover the transistor and include a third opening connected to the first opening.

The first insulation interlayer structure may include first through $n^{th}$ etching stop layers sequentially stacked on the lower insulation layer and first through $(n-1)^{th}$ insulation interlayers sequentially interposed between the first through $n^{th}$ etching stop layers, respectively, where n is a positive integer greater than 1, and the second insulation interlayer structure may include a lower portion including the first through $n^{th}$ etching stop layers and the first through $(n-1)^{th}$ insulation interlayers extended to the second area from the first area and an upper portion having first through $m^{th}$ insulation interlayer patterns sequentially stacked on the $n^{th}$ etching stop layer and first through $(m-1)^{th}$ etching stop layers sequentially interposed between the first through $m^{th}$ insulation interlayer patterns, respectively, where m is a positive integer greater than 1.

The insulation pattern structure may include a first silicon oxide pattern and a first silicon nitride pattern sequentially stacked on the substrate. The silicon nitride pattern corresponding to the photodiode may be formed to a thickness of about 400 Å. The insulation pattern structure may further include a second silicon oxide pattern and a second silicon nitride pattern sequentially stacked on the first silicon nitride pattern. The first silicon nitride pattern is exposed through the second silicon oxide pattern and the second silicon nitride pattern corresponding to the photodiode.

According to another exemplary embodiment of the present invention, a method of manufacturing an image sensor includes forming a photodiode on a substrate, and forming an insulation pattern structure on the substrate, the insulation pattern structure making contact with the photodiode. An anti-reflection layer is formed on the insulation pattern structure and on the substrate. A first preliminary insulation interlayer is formed on the anti-reflection layer and includes at least one insulation layer in which a metal wiring structure is formed. The first preliminary insulation interlayer structure and the anti-reflection layer are sequentially etched away, forming a first insulation interlayer structure having a second opening corresponding to the photodiode and forming an anti-reflection pattern having a second opening connected to the first opening. A transparent insulation pattern is formed in the first and second openings, and a color filter is formed on the transparent insulation pattern. A micro lens is formed on the color filter.

In an exemplary embodiment of the present embodiment, forming the insulation pattern structure includes sequentially forming a silicon oxide layer and a silicon nitride layer on the substrate, and anisotropically etching the silicon nitride layer and the silicon oxide layer. A transistor may be formed on the substrate prior to the insulation pattern structure.

According to still another exemplary embodiment of the present invention, a method of manufacturing an image sensor includes providing a substrate on which a first area and a second area are defined is provided, wherein a photodiode is formed in the first area of the substrate. An insulation pattern structure making contact with the photodiode is formed in the first area of the substrate. An anti-reflection pattern is formed on the insulation pattern structure and on the substrate. A preliminary insulation interlayer structure having a plurality of insulation layers is formed on the anti-reflection pattern and on the substrate. The preliminary insulation interlayer structure includes a first metal wiring structure in the first area and a second metal wiring structure, wherein a top surface of the second metal wiring structure is above that of the first metal wiring structure in the second area. A recess portion is formed in the first area of the substrate by partially etching the preliminary insulation interlayer structure, forming a first preliminary insulation interlayer structure on the first area of the substrate and a forming a second preliminary insulation interlayer structure on the second area of the substrate. The first preliminary insulation interlayer structure and the anti-reflection layer are partially etched away corresponding to the photodiode, forming a first insulation interlayer structure having a second opening and an anti-reflection pattern having a first opening connected to the second opening. A transparent insulation pattern is formed in the first and second openings, and a color filter is formed on the transparent insulation pattern. A micro lens is formed on the color filter.

A pad electrode may be formed on a top surface of the second metal wiring structure after the second metal wiring structure is formed. Electric signals transfer from/to the image sensor through the electrode pad. The first and second metal wiring structures may comprise copper. In an exemplary embodiment of the present invention, forming the transparent insulation pattern includes forming a transparent insulation layer on a bottom portion of the recess portion to a thickness to fill the first and second openings, and etching the transparent insulation layer until the bottom portion of the recess portion is exposed and the transparent insulation layer only remains in the first and second openings.

In an exemplary embodiment of the present invention, the preliminary insulation interlayer structure includes forming first insulation interlayer on the substrate, and forming a first subsidiary wiring in the first insulation interlayer, the first subsidiary wiring making contact with a first contact plug that is formed at a lower portion thereof. A second insulation interlayer is formed on the first insulation interlayer and the first subsidiary wiring, and second contact plugs making contact with the first subsidiary wiring are formed in the second insulation interlayer. A third insulation interlayer is formed on the second insulation interlayer and the second contact plugs, and a second subsidiary wiring making contact with the second contact plug is formed in the third insulation interlayer. A fourth insulation interlayer is formed on the third insulation interlayer and the second subsidiary wiring, and third contact plugs making contact with the second subsidiary wiring penetrating the fourth insulation interlayer are formed in the second area of the substrate. A fifth insulation interlayer is formed on the fourth insulation interlayer and the third contact plug, and a third subsidiary wiring making contact with the third contact plug is formed in the fifth insulation interlayer. A sixth insulation interlayer is formed on the fifth insulation interlayer, and a third subsidiary wiring and fourth contact plugs making contact with the third subsidiary wiring are formed in the sixth insulation interlayer. A seventh insulation interlayer is formed on the sixth insulation interlayer and the fourth contact plug. A fourth subsidiary wiring making contact with the fourth contact plug is formed in the seventh insulation interlayer. First through sixth etching stop layers may be formed on each boundary surface of the first through seventh insulation interlayers. The etching stop layer may comprise a non-transparent material. A transistor may be further formed on the substrate prior to the insulation pattern structure.

In an exemplary embodiment of the present invention, forming the insulation pattern structure includes sequentially forming a silicon oxide layer and a silicon nitride layer on the substrate. A photoresist pattern is formed on the silicon nitride layer. The first area in which the photodiode is formed is covered with the photoresist pattern and the second area is exposed through the photoresist pattern. The silicon nitride layer and the silicon oxide layer are anisotropically etched using the photoresist pattern as an etching mask. A first spacer comprising silicon oxide and a second spacer comprising silicon nitride may be formed on a sidewall of a gate electrode of the transistor in the anisotropic etching process.

In an exemplary embodiment of the present invention, the insulation pattern structure further includes forming a preliminary additional silicon oxide pattern and a preliminary additional silicon nitride pattern on the silicon nitride pattern, and etching the preliminary additional silicon oxide pattern and the preliminary additional silicon nitride pattern after etching the anti-reflection layer.

BRIEF DESCRIPTION OF THE DRAWINGS

The present invention will become readily apparent to those of ordinary skill in the art when descriptions of exemplary embodiments thereof are read with reference to the accompanying drawings.

DETAILED DESCRIPTION OF EXEMPLARY EMBODIMENTS

Figure 1:
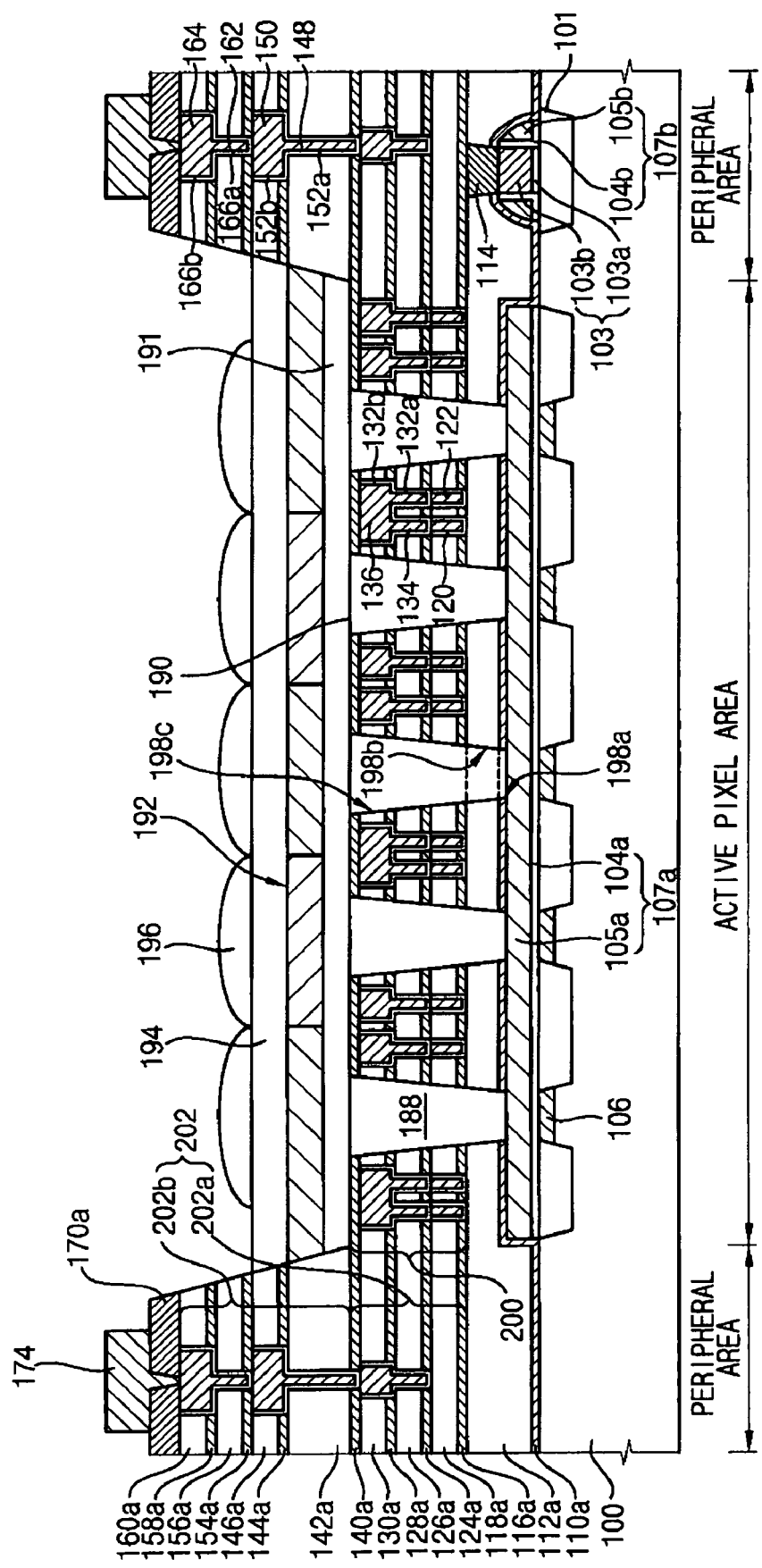
FIG. 1 is a cross-sectional view illustrating an image sensor according to an exemplarily embodiment of the present invention.

Hereinafter, exemplary embodiments of the present invention are described in detail with reference to the accompanying drawings. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. Like reference numerals refer to similar or identical elements throughout the description of the figures. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary Embodiment 1

Figure 2:
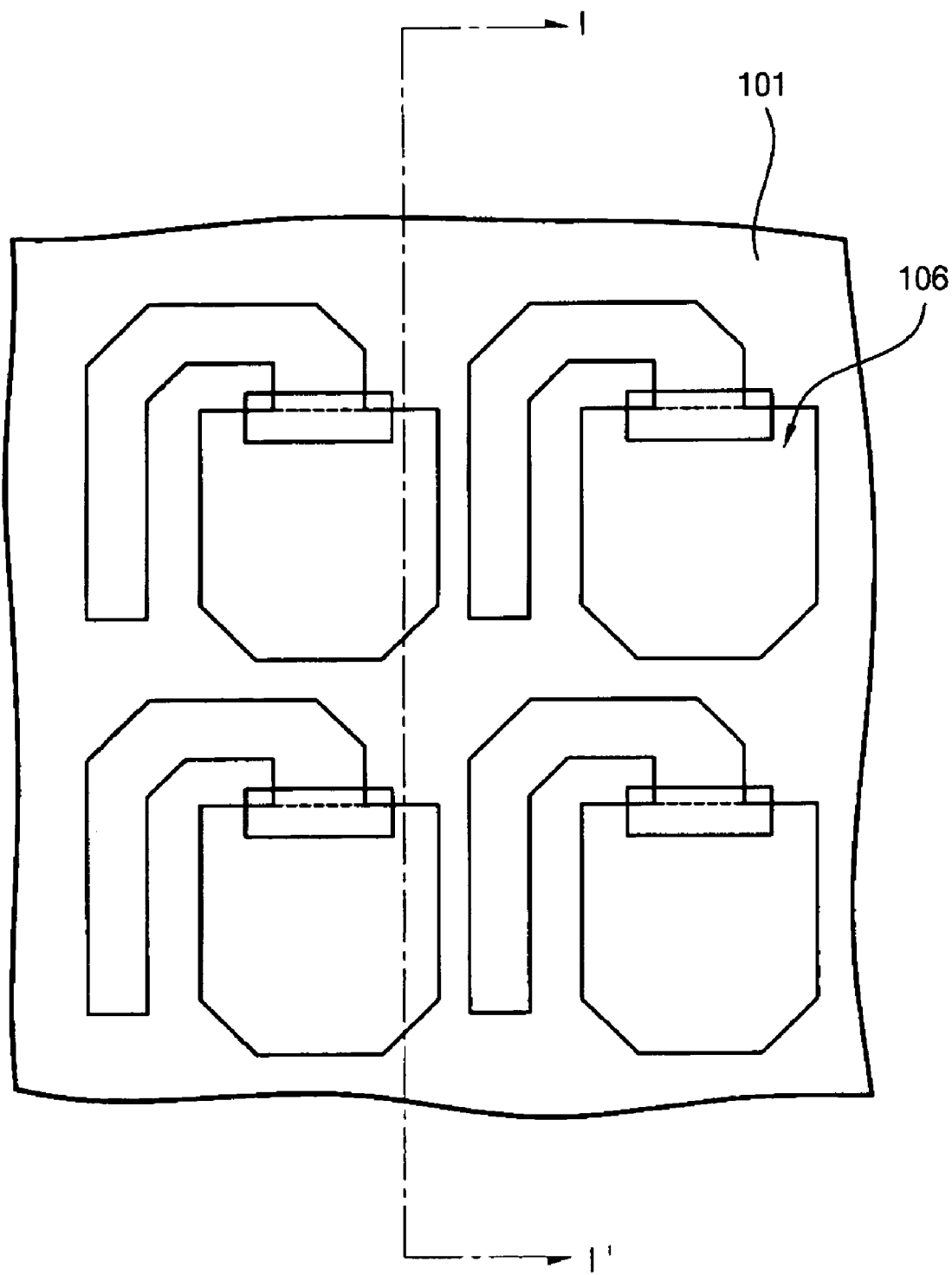
FIG. 2 is a plan view partially illustrating an active pixel area of the image sensor shown in FIG. 1.

FIG. 1 is a cross-sectional view illustrating an image sensor according to a first exemplary embodiment of the present invention. FIG. 2 is a plan view partially illustrating an active pixel area of the image sensor shown in FIG. 1. FIG. 1 is a cross-sectional view taken along a line I-I' of FIG. 2.

Referring to FIG. 1, a substrate such as a silicon wafer is provided and an active pixel area and a peripheral area are defined on the substrate 100. An active region in which conductive structures are formed is defined on the substrate 100 by a field region in which a field oxide layer 101 is formed, for example, by a shallow trench isolation (STI) process. The active region and a device isolation region are also defined on the substrate 100.

A photodiode 106 is formed on the substrate 100 of the active pixel area as a light receiving element, and a transistor (not shown) is formed on the substrate 100 adjacent to the photodiode 106 as a switching element. In an exemplary embodiment of the present invention, a unit pixel in the active pixel area includes a photodiode 106 and at least one transistor 103.

The transistor 103 in the active pixel area includes a gate electrode 103b formed on the substrate 100 with a gate insulation layer 103a interposed between the gate electrode 103b and the substrate 100 and source/drain regions (not shown) formed at both side portions of the gate electrode 103b. A gate spacer 107 is formed on a sidewall of the gate electrode 103b. The gate spacer 107 includes a first spacer 104b that comprises silicon oxide and makes contact with the gate electrode 103b and the substrate 100. A second spacer 105b that comprises silicon nitride is formed on the first spacer 104b. The first spacer 104b may be formed into a middle temperature oxide (MTO) layer.

An insulation pattern structure 107a is formed on the photodiode 106 and makes direct contact with the photodiode 106. The insulation pattern structure 107a includes a silicon oxide pattern 104a that may comprise the same material as the first spacer 104b and a silicon nitride pattern 105a that may comprise the same material as the second spacer 105b. The silicon oxide pattern 104a and the silicon nitride pattern 105a are sequentially stacked on the substrate 100.

An anti-reflection layer (not shown) is formed on the silicon nitride pattern 105a, the substrate 100, the gate spacer 107 and a surface of the gate electrode 103b. A first opening 198a and a first peripheral opening (not shown) are formed in the anti-reflection layer, thereby forming an anti-reflection pattern 110a on the silicon nitride pattern 105a, the substrate 100, the gate spacer 107 and the surface of the gate electrode 103b. The silicon nitride pattern 105a is exposed through the first opening 198a corresponding to the photodiode 106. A top surface of the gate electrode 103b is exposed through the peripheral opening 114a. In an exemplary embodiment of the present invention, the entire surface of the substrate 100 is covered with the anti-reflection pattern 110a except for portions thereof corresponding to the photodiode 106 and the gate electrode 114a. Although the light that is incident onto a first unit pixel is refracted from the first unit pixel, the refracted light may not be incident onto a photodiode of a second unit pixel adjacent to the first unit pixel due to the anti-reflection pattern 110a, minimizing the crosstalk of the image sensor.

A lower insulation layer (not shown) is formed on the anti-reflection pattern 110a. A second opening 198b and a second peripheral opening (not shown), which are connected to the first opening 198a and the first peripheral opening, respectively, that are formed in the lower insulation layer. The lower insulation layer is formed to a sufficient thickness to cover underlying structures including the transistor 103, second opening 198b, and second peripheral opening (not shown), thereby forming a lower insulation pattern 112a on the anti-reflection pattern 110a. The silicon nitride pattern 105a corresponding to the photodiode 106 is exposed through the first and second openings 198a and 198b. The top surface of the gate electrode 103b is exposed through the first and second peripheral openings. A first contact plug 114 is formed in the first and second peripheral openings of the lower insulation pattern 112a, so that the source/drain regions and the gate electrode 103b make contact with the first contact plug 114. In an exemplary embodiment of the present invention, the first contact plug includes a tungsten plug comprising a composition of tungsten and titanium/titanium nitride.

A first insulation interlayer structure 200, including at least one insulation thin layer, is formed on the lower insulation pattern 112a in the active pixel area of the substrate 100. A first metal wiring structure is formed in the thin layer insulation of the first insulation interlayer structure 200. The first insulation interlayer structure 200 may be formed to a thickness substantially identical to a height of the first metal wiring structure. A third opening 198c corresponding to the photodiode 106 is formed in the first insulation interlayer structure 200.

A second insulation interlayer structure 202, including at least one insulation thin layer, is formed on the lower insulation pattern 112a in the peripheral area of the substrate 100. A top surface of the second insulation interlayer structure 202 is higher than that of the first insulation interlayer structure 200. A second metal wiring structure is formed in the thin layer insulation of the second insulation interlayer structure 202. A top surface of the second metal wiring structure is higher than that of the first metal wiring structure.

Hereinafter, the first insulation interlayer structure 200, the second insulation interlayer structure 202, the first metal wiring structure and the second metal wiring structure are described in detail. In an exemplary embodiment of the present invention, an image sensor includes the first insulation interlayer structure 200, the second insulation interlayer structure 202, the first metal wiring structure and the second metal wiring structure, wherein the first metal wiring structure comprises a three-layer wiring structure.

The first insulation interlayer structure 200 includes a first etching stop pattern 116a formed on the lower insulation pattern 112a. An etching process is stopped and copper is prevented from diffused by the first etching stop pattern 116a. In an exemplary embodiment of the present invention, the first etching stop pattern 116a comprises an opaque material such as, for example, silicon nitride and/or silicon carbide (SiC). The first etching stop pattern 116a is formed to a sufficiently thin thickness such that light may pass through the first etching stop pattern 116a, even though the first etching stop pattern 116a comprises an opaque material.

A first insulation interlayer pattern 118a is formed on the first etching stop pattern 116a, and a trench exposing a top surface of the first contact plug 114 is formed in the first insulation interlayer pattern 118a. In an exemplary embodiment of the present invention, the first insulation interlayer pattern 118a comprises a transparent and insulating material such as, for example, silicon oxide. A plurality of other insulation interlayer patterns may be formed on the first insulation interlayer pattern 118a using, for example, the same material as the first insulation interlayer pattern 118a.

A first subsidiary wiring 122 is formed in the trench of the first insulation interlayer pattern 118a as a line shape and makes electrical contact with the first contact plug 114. For example, the first subsidiary wiring 122 may comprise copper. Hereinafter, in the interests of clarity and simplicity, wiring such as the first subsidiary wiring 122 and electrically conductive material in the contact plugs will be referred to as copper. However, it is to be understood that wiring and electrically conductive material in the contact plugs may comprise any electrically conductive material. For example, the electrically conducting material could be palladium, an alloy of palladium, palladium cobalt, platinum, gold, an alloy of gold, copper, an alloy of copper, aluminum, rhodium, cobalt, an alloy of cobalt, nickel, an alloy of nickel, cadmium, lead, tin, an alloy of tine, silver and combinations thereof. A first barrier metal pattern 120 is formed at a bottom surface and sidewalls of the first subsidiary wiring 122, so that the copper is prevented from diffusing into surroundings.

A second etching stop pattern 124a is formed on the first insulation interlayer pattern 118a. An etching process is stopped and copper is prevented from diffused by the second etching stop pattern 124a.

A second insulation interlayer pattern 126a is formed on the second etching stop pattern 118a, and a contact hole exposing a top surface of the first subsidiary wiring 122 is formed in the second insulation interlayer pattern 126a. A second contact plug 134 is formed in the contact hole of the second insulation interlayer pattern 126a and makes electrical contact with the first subsidiary wiring 122. For example, the second contact plug 134 comprises an electrically conductive material such as copper. A second barrier metal pattern 132a is formed at a bottom surface and sidewalls of the second contact plug 134, so that the copper is prevented from diffusing into the second insulation interlayer pattern 126a.

A third etching stop pattern 128a is formed on the second insulation interlayer pattern 126a. An etching process is stopped and copper is prevented from diffused by the third etching stop pattern 126a.

A third insulation interlayer pattern 130a is formed on the third etching stop pattern 128a. A trench exposing a top surface of the second contact plug 134 is formed in the third insulation interlayer pattern 130a. A second subsidiary wiring 136 is formed in the trench of the third insulation interlayer pattern 130a as a line shape and makes electrical contact with the second contact plug 134. For example, the second subsidiary wiring 136 comprises copper. A third barrier metal pattern 132b is formed at a bottom surface and sidewalls of the second subsidiary wiring 136, so that the copper is prevented from diffusing into the third insulation interlayer pattern 130a.

In an exemplary embodiment of the present invention, the second and third insulation interlayer patterns comprise a transparent material such as, for example, silicon oxide.

A fourth etching stop pattern 140a is formed on the third insulation interlayer pattern 130a. An etching process is stopped and copper is prevented from diffused by the fourth etching stop pattern 140a.

As described above, in an exemplary embodiment of the present invention, the first metal wiring structure includes the first subsidiary wiring, the second contact plug and the second subsidiary wiring.

The first insulation interlayer structure 200 further includes the third opening 198c penetrating the fourth etching stop pattern 140a to the first etching stop pattern 116a corresponding to the photodiode 106 in the active pixel area of the substrate 100. The third opening 198c is connected with the second opening 198b, so that the top surface of the silicon nitride pattern 105a is exposed through the first, second and third openings 198a, 198b and 198c. Light that is incident onto the photodiode 106 of the unit pixel of the image sensor through the first, second and third openings 198a, 198b and 198c.

The silicon nitride pattern 105a and the silicon oxide pattern 104a remain on the photodiode 106 of the unit pixel. In an exemplary embodiment of the present invention, the silicon nitride pattern 105a is formed to a thickness less than about 400 Å. When the silicon nitride pattern 105a has a thickness of no less than about 400 Å, light is not sufficiently incident onto the photodiode 106.

Hereinafter, the second insulation interlayer structure 202 will be described in detail.

The second insulation interlayer structure 202 is formed on the lower insulation pattern 112 in the peripheral area of the substrate 100, and includes the first etching stop pattern 116a, the first insulation interlayer pattern 118a, the second etching stop pattern 124a, the second insulation interlayer pattern 126a, the third etching stop pattern 128a, the third insulation interlayer pattern 130a and the fourth etching stop pattern 140a that are extended from the active pixel area of the substrate 100. Hereinafter, the first etching stop pattern 116a, the first insulation interlayer pattern 118a, the second etching stop pattern 124a, the second insulation interlayer pattern 126a, the third etching stop pattern 128a, the third insulation interlayer pattern 130a and the fourth etching stop pattern 140a in the peripheral area of the substrate 100 are collectively referred to as underlying structure 202a of the second insulation interlayer structure 202.

A portion of the second metal wiring structure may be formed in the underlying structure 202a, for example, so that electric circuits may be formed in the peripheral area of the substrate 100.

A fourth insulation interlayer pattern 142a is formed on the underlying structure 202a of the second insulation interlayer structure 202, and a contact hole is formed in the fourth insulation interlayer pattern 142a. In an exemplary embodiment of the present invention, the fourth insulation interlayer pattern 142a is only formed in the peripheral area of the substrate 100.

A third contact plug 148 is formed in the contact hole of the fourth insulation interlayer pattern 142a. The third contact plug 148 comprises an electrically conductive material such as copper. A fourth barrier metal pattern 152a is formed at a bottom surface and sidewalls of the third contact plug 148, so that the copper is prevented from diffusing into the fourth insulation interlayer pattern 142a.

A fifth etching stop pattern 144a is formed on the fourth insulation interlayer pattern 142a. An etching process is stopped and copper is prevented from diffused by the fifth etching stop pattern 144a.

A fifth insulation interlayer pattern 146a is formed on the firth etching stop pattern 144a, and a trench exposing a top surface of the third contact plug 148 is formed in the fifth insulation interlayer pattern 146a. A third subsidiary wiring 150 is formed in the trench of the fifth insulation interlayer pattern 146a as a line shape and makes electrical contact with the third contact plug 148. A fifth barrier metal pattern 152b is formed at a bottom surface and sidewalls of the third subsidiary wiring 150, so that the copper is prevented from diffusing into the fifth insulation interlayer pattern 146a.

A sixth etching stop pattern 154a is formed on the fifth insulation interlayer pattern 146a. An etching process is stopped and copper is prevented from diffused by the sixth etching stop pattern 154a.

In an identical or similar fashion, a sixth insulation interlayer pattern 156a, a fourth contact plug 162, a seventh etching stop pattern 158a, a seventh insulation interlayer pattern 160a and a fourth subsidiary wiring 164 may be further formed on the sixth insulation interlayer pattern 154a. Further, additional wiring structures may be further formed on the seventh insulation interlayer pattern 160a, for example, by repetition of the above-described process.

A sixth barrier metal pattern 166a is formed at a bottom surface and sidewalls of the fourth contact plug 162, so that the copper is prevented from diffusing into the sixth insulation interlayer pattern 156a. A seventh barrier metal pattern 166b is formed at a bottom surface and sidewalls of the fourth subsidiary wiring 164, so that the copper is prevented from diffusing into the seventh insulation interlayer pattern 160a.

The fourth insulation interlayer pattern 142a, the fifth etching stop pattern 144a, the fifth insulation interlayer pattern 146a, the sixth etching stop pattern 154a, the sixth insulation interlayer pattern 156a, the seventh etching stop pattern 158a and the seventh insulation interlayer pattern 160a are only formed in the peripheral area of the substrate 100, and are collectively referred to as upper structure 202b of the second insulation interlayer structure 202. The upper structure 202b of the second insulation interlayer structure 202 is only formed in the peripheral area of the substrate 100, so that a top surface of the first insulation interlayer structure 200 is lower than that of the second insulation interlayer structure 202.

A first transparent insulation pattern 188 is formed in the first, second and third openings 198a, 198b and 198c, and comprises a synthetic resin such as, for example, novolac resin, polyimide resin and/or polycarbonate resin.

A refractive index of the first transparent insulation pattern 188 may be higher than that of the first, second and third insulation interlayer patterns 118a, 126a and 130a of the first insulation interlayer structure 200, so that most of the light that is incident onto the first transparent insulation pattern 188 passes to the photodiode 106. For example, when the first, second and third insulation interlayer patterns 118a, 126a and 130a comprise fluorine doped silicate glass (FSG) for which the refractive index is about 1.4, the first transparent insulation pattern comprises a material for which the refractive index is more than about 1.4, for example, a material for which the refractive index is about 1.5. In an exemplary embodiment of the present invention, the higher refractive index of the first transparent insulation pattern 188, as compared to that of the first, second and third insulation interlayer pattern 118a, 126a and 130a, prevents the light passing through the first, second and third openings 198a, 198b and 198c from leaking from the first, second and third openings 198a, 198b and 198c and being incident onto an adjacent photodiode in a neighboring unit pixel.

The light passing through the first transparent insulation pattern 188 is incident on the photodiode 106 under the first transparent insulation pattern 188. As shown in FIG. 2, a top surface of the first transparent insulation pattern 188 is lower than that of the top surface of the second insulation interlayer structure 202.

In an exemplary embodiment of the present invention, an optical path to the photodiode 106 of the unit pixel may be shortened, so that the photosensitivity of the unit pixel may be improved. In exemplary embodiments of the present invention, the light is prohibited from being incident on neighboring pixels, so that the pixel crosstalk may be minimized.

A protection pattern 170a may be further formed on the second insulation interlayer structure 202 including the second metal wiring structure so as to protect structures in the peripheral area of the substrate 100. The protection pattern 170a may be a single layer pattern, for example, comprising silicon oxide or silicon nitride, or the protection pattern 170a may be a multi-layer pattern in which, for example, a silicon oxide layer and a silicon nitride layer are sequentially stacked on the second insulation interlayer structure 202.

A contact exposing a top portion of the fourth subsidiary wiring 164, which is a top wiring of the second metal wiring structure, is formed in the protection pattern 170a. A pad electrode 174 is formed on the protection pattern 170a to such a sufficient thickness to fill up the contact hole of the protection pattern 170a. The fourth subsidiary wiring 164 makes electrical contact with the pad electrode 174.

A planarization pattern 191 is formed on the first insulation interlayer structure 200 and the first transparent insulation pattern 188 in the active pixel area of the substrate 100 to a thickness of about 0.2 μm to about 0.6 μm. The planarization pattern 191 may comprise, for example, a resin or a flowable oxide resin.

A plurality of color filters 192 is formed on the planarization pattern 191 and in correspondence to the photodiodes 106 below the planarization pattern 191, respectively.

A second transparent insulation pattern 194 is formed on the color filters 192 to a thickness of about 0.2 μm to about 0.6 μm. The second transparent insulation pattern 194 may comprise a resin or a flowable oxide.

A micro lens 196 is formed on the second transparent insulation pattern 194 to a thickness of about 0.2 μm to about 0.6 μm, so that light is focused into the photodiode 106.

In the above-described image sensor, in accordance with an exemplary embodiment of the present invention, an anti-reflection pattern is formed between transparent insulation patterns through which light passes, so a refracted light from the transparent insulation pattern is prevented from being incident on a neighboring photodiode, and no pixel crosstalk is generated in operating the image sensor.

FIGS. 3 to 10 are cross-sectional views illustrating processing steps for a method of forming the image sensor shown in FIG. 1.

Figure 3:
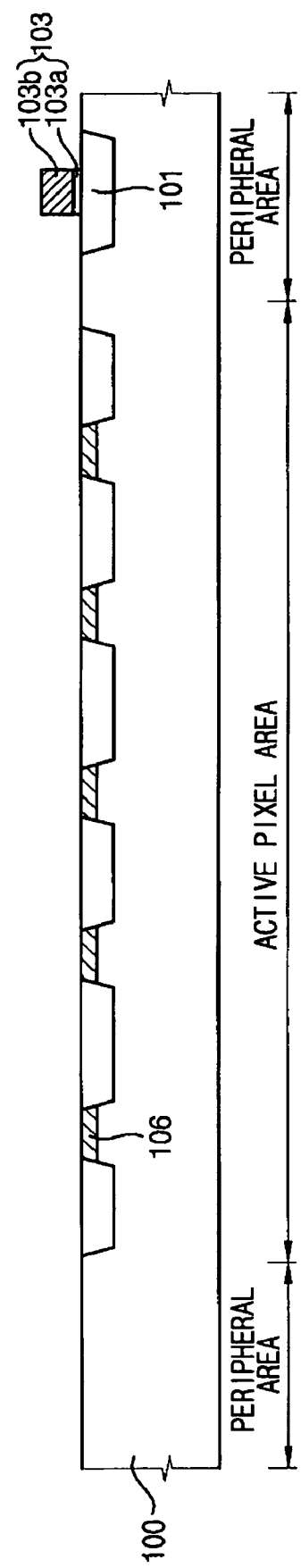
FIGS. 3 to 10 are cross-sectional views illustrating processing steps for a method of forming the image sensor shown in FIG. 1.

Referring to FIG. 3, an active pixel area including a unit pixel and a peripheral area including, for example, electronic circuits are defined on a substrate 100. A device isolation layer 101 is formed on the substrate 100, for example, by a shallow trench isolation (STI) process, thereby defining an active region in which conductive structures are formed.

A photodiode 106 is formed in the active pixel area of the substrate 100 by selectively doping impurities at surface portions of the active region of the substrate 100.

A gate insulation layer 103a, a gate electrode 103b and source/drain regions (not shown) are formed on the substrate 100. In an exemplary embodiment of the present invention, an operation transistor (not shown) is formed on the active pixel area of the substrate 100, and a logic transistor 103 for operating a logic device is formed on the peripheral area of the substrate 100. A plurality of electron/hole pairs is generated in the photodiode 106 by the light that is incident thereon, and the operation transistor is operated by the electron/hole pairs.

Figure 4:
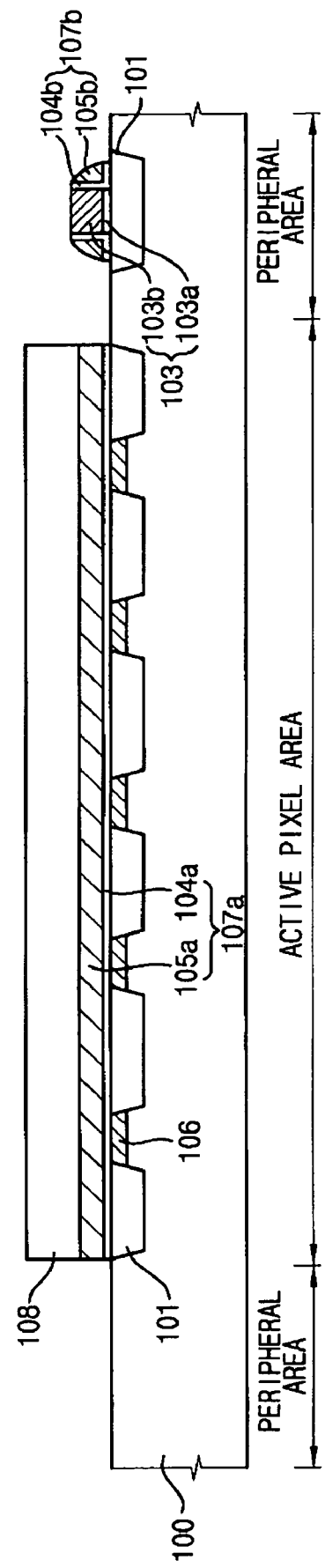

Referring to FIG. 4, an insulation layer (not shown) is formed on the substrate 100 and on a surface of the gate electrode 103b. In an exemplary embodiment of the present invention, the insulation layer is formed into a double layer structure in which a silicon oxide layer (not shown) and a silicon nitride layer (not shown) are sequentially stacked on the substrate 100 and the gate electrode 103b. When the silicon nitride layer makes contact with the substrate 100, cracking may occur in the silicon nitride layer due to an internal stress. However, in exemplary embodiments of the present invention, the silicon oxide layer prevents the stress in the silicon nitride layer and thereby prevents the occurrence of cracking in the silicon nitride layer.

A photoresist film is coated on the insulation layer and is partially removed by a photolithography process, thereby forming a first photoresist pattern 108 wherein the insulation layer in the peripheral area is exposed and the insulation layer in the active pixel area is covered. Then, the insulation layer is anisotropically etched using the photoresist pattern 108 as an etching mask to form a gate spacer 107b on the sidewalls of the gate electrode 103b and a preliminary insulation pattern 107a on the substrate 100 of the active pixel area.

In an exemplary embodiment of the present invention, the preliminary insulation pattern 107a includes a preliminary silicon oxide pattern 104a and a preliminary silicon nitride pattern 105a that are sequentially stacked on the substrate 100 of the active pixel area. In the same way, the gate spacer 107b includes a first spacer 104b comprising silicon oxide and a second spacer 105b comprising silicon nitride.

An ion implantation process may be performed at both side portions of the gate electrode 103 after forming the gate spacer 107b, thereby forming heavily doped source/drain regions.

Thereafter, the first photoresist pattern 108 is removed from the substrate 100, although not shown in FIG. 4.

Figure 5:
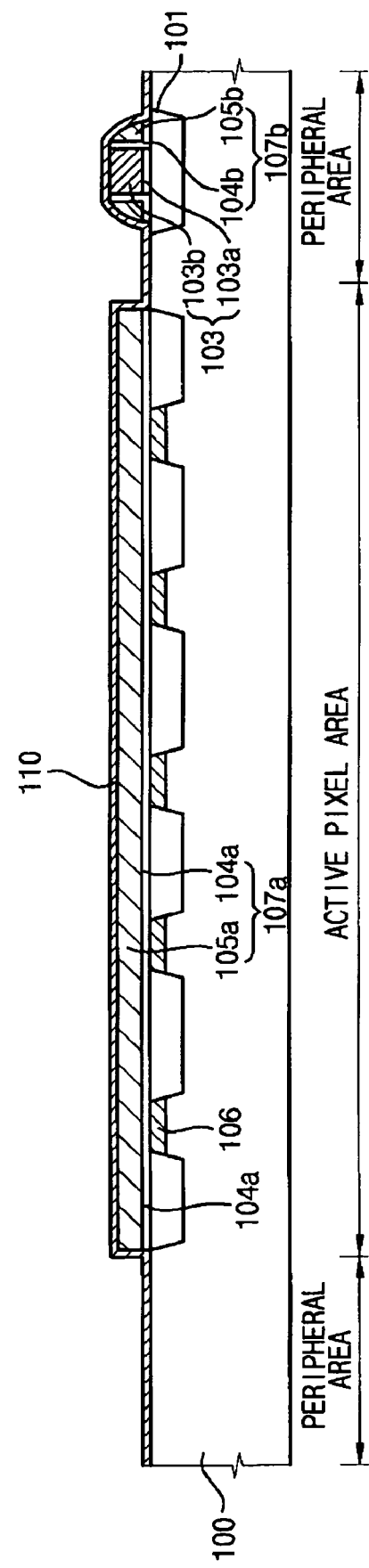

Referring to FIG. 5, an anti-reflection layer 110 is formed on the preliminary silicon nitride pattern 105a, on the substrate 100, on the gate spacer 107b and on a surface of the gate electrode 103b. The anti-reflection layer 110 comprises, for example, silicon oxynitride (SiON) and/or silicon nitride (SiN) formed by any suitable deposition process. Silicon nitride may generate a crack in the substrate 100 due to a stress in deposition process, so that silicon oxynitride is used as the anti-reflection layer 110, in accordance with an exemplary embodiment of the present invention.

The anti-reflection layer 110 prevents a diffused reflection in a subsequent photolithography process and functions as an etching stop layer in a subsequent etching process.

Figure 6:
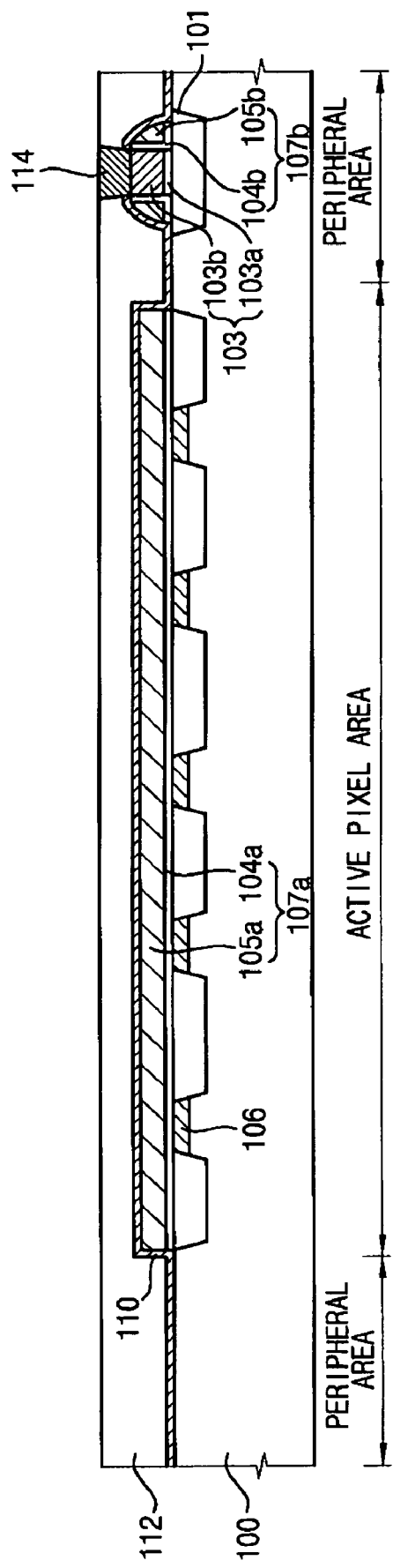

Referring to FIG. 6, a lower insulation layer 112 is formed on the anti-reflection layer 110 to a sufficient thickness to cover the transistor 103. The lower insulation layer 112 may comprise a transparent material such as, for example, a material based on a silicon oxide.

A first contact hole (not shown) is formed in the lower insulation layer 112 by a photolithography process, so that a contact area such as the source/drain regions or the gate electrode 103b of the transistor 103 may be exposed through the first contact hole.

An electrically conductive material such as a metal is deposited into the first contact hole to form a first contact plug 114 in the first contact hole. For example, a titanium/titanium nitride layer (not shown) may be formed on a top surface of the lower insulation layer 112, the sidewalls of the contact hole and a top surface of the contact area as a barrier metal layer. A tungsten layer may be formed on the barrier metal layer to a sufficient thickness to fill up the contact hole. Then, the tungsten layer is planarized until the top surface of the lower insulation layer 112 is exposed to form the contact plug 114 in the contact hole.

Figure 7:
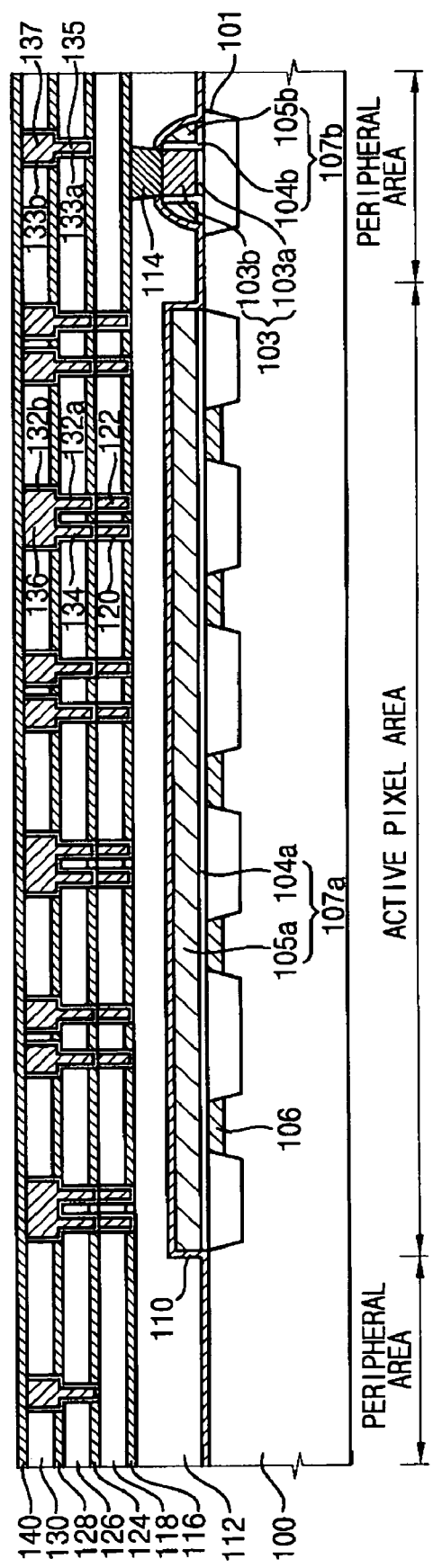

Referring to FIG. 7, a first etching stop layer 116 is formed on the top surface of the lower insulation layer 112 and a top surface of the first contact plug 114. The first etching stop layer 116 functions as a diffusion barrier layer in a subsequent process as well as an etching stop layer.

In an exemplary embodiment of the present invention, the first etching stop layer 116 is formed to a thickness of about 200 Å to about 1000 Å and comprises silicon nitride (SiN) or silicon carbide (SiC). First impurities such as, for example, oxygen and nitrogen may be further doped with silicon carbide (SiC). Second impurities such as, for example, oxygen may be further doped with silicon nitride (SiN).

Some portions of the first etching stop layer 116, which comprises a non-transparent material such as, for example, silicon carbide (SiC) and/or silicon nitride (SiN), corresponding to the photodiode 106 are to be removed in a subsequent process, so that light is sufficiently supplied to the photodiode under the first etching stop layer 116 from surroundings.

A first insulation interlayer 118 is formed on the first etching stop layer 116 and comprises a transparent material such as, for example, silicon oxide and/or fluorinated silicate glass (FSG).

The first insulation interlayer 118 and the first etching stop layer 106 are partially etched away by a photolithography process, thereby forming first trenches (not shown) on the substrate 100 of the active pixel area and the peripheral area. The first trench is formed alternately with the photodiode 106 in the active pixel area of the substrate 100, and the top surface of the lower insulation layer 112 is partially exposed through the first trenches.

A first barrier metal layer (not shown) is formed on a top surface of the first insulation interlayer 118, the sidewalls of the first trench and on the exposed top surface of the lower insulation layer 112. The first barrier metal layer may be a single layer structure such as, for example, a tantalum layer or a tantalum nitride layer, or the first barrier metal layer may be a multi-layer structure in which, for example, a tantalum layer and a tantalum nitride layer are sequentially stacked by a deposition process.

A first copper layer (not shown) is formed on the first barrier metal layer to a sufficient thickness to fill up the first trenches. For example, a copper seed is deposited onto the first barrier metal layer by a sputtering process and then the copper seed is formed into to the first copper layer by an electroplating process. The copper seed may be formed into the first copper layer by an electrolysis plating process.

The first copper layer and the first barrier metal layer are planarized, for example, by a chemical mechanical polishing (CMP) process until the top surface of the first insulation interlayer 118. The first barrier metal layer only remains in the first trench to form a first barrier metal pattern 120, and the first copper layer remains in the first trench including the first barrier metal pattern 120 to form a first subsidiary metal wiring 122.

A second etching stop layer 124 is formed on the top surface of the first insulation interlayer 118 and on the first subsidiary metal wiring 122. A second insulation interlayer 126, a third etching stop layer 128 and a third insulation interlayer 130 are sequentially formed on the second etching stop layer 124.

The third insulation interlayer 130, the third etching stop layer 128, the second insulation interlayer 126 and the second etching stop layer 124 are partially etched away by a photolithography process, thereby forming a second contact hole (not shown) partially exposing the first subsidiary metal wiring 122 exposed in the active pixel area of the substrate 100. In the peripheral area of the substrate 100, a second peripheral contact hole may or may not be formed according to the processing conditions.

The third insulation interlayer 130 and the third etching stop layer 128 are partially etched away in the active pixel area of the substrate 100, thereby forming a line-shaped second trench (not shown) that is connected with at least one of the second contact holes in the active pixel area of the substrate 100. In the same way, a line-shaped second peripheral trench, which is connected with at least one of the second peripheral contact hole, may be formed in the peripheral area of the substrate 100. The second contact holes and the second trenches may be formed alternately with the photodiodes 106 in the active pixel area of the substrate 100.

Although in the above-described exemplary embodiment, the second trench is formed after the second contact hole, it will be understood that the second contact hole may be formed after the second trench.

A second barrier metal layer (not shown) is formed on a top surface of the third insulation interlayer 130, on the sidewalls of the second trench and the second contact hole and on the exposed surface of the first subsidiary metal wiring 122. A second copper layer is formed on the second barrier metal layer to a sufficient thickness to fill up the second trench and the second contact hole. Then, the second copper layer is planarized until the top surface of the third insulation interlayer 130 by a CMP process.

In an exemplary embodiment of the present invention, the second barrier metal layer only remains in the second contact hole to thereby form a second barrier metal pattern 132a and only remains in the second trench to thereby form a third barrier metal pattern 132b. Further, the second copper layer only remains in the second contact hole defined by the second barrier metal pattern 132a to form a second contact plug 134 and only remains in the second trench defined by the third barrier metal pattern 132b to thereby form a second subsidiary metal wiring 136.

In an exemplary embodiment of the present invention, a second peripheral contact plug 135 is formed in the second insulation interlayer 126 at the peripheral area of the substrate 100, and a second peripheral subsidiary metal wiring 137 is formed in the third insulation interlayer 130 at the peripheral area of the substrate 100. The second peripheral contact plug 135 is formed in a body together with the second peripheral subsidiary metal wiring 137 when the second contact plug 134 and the second subsidiary metal wiring 136 are formed. Further, a second peripheral contact barrier metal pattern 133a is formed on the sidewalls and bottom surface of the second peripheral contact plug 135, and a second peripheral subsidiary metal wiring barrier metal pattern 133b is formed on the sidewalls and bottom surface of the second peripheral subsidiary metal wiring 137.

A fourth etching stop layer 140 is formed on the top surface of the third insulation interlayer 130, on a top surface of the second subsidiary metal wiring 136 and on a top surface of the second peripheral subsidiary metal wiring 137.

Although in the above-described exemplarily embodiment of the present invention, the contact plug and the subsidiary metal wiring are formed by a dual damascene process, it will be understood that the contact plug and the subsidiary metal wiring may be formed by any other process known to one of the ordinary skill in the art such as a damascene process. For example, by the damascene process, the second contact plug 134 is firstly formed in the second insulation interlayer 126, and then the third insulation interlayer 130 is formed on the second insulation interlayer 126. Finally, the second subsidiary metal wiring 136 is formed in the third insulation interlayer 130.

As a result, a first metal wiring structure including a first contact plug (not shown), the first subsidiary metal wiring 122, the second contact plug 134 and the second subsidiary metal wiring 136 are formed in the active pixel area of the substrate 100. Further, a second metal wiring structure including the second peripheral contact plug 135 and the second peripheral subsidiary metal wiring 137 is formed in the peripheral area of the substrate 100.

Figure 8:
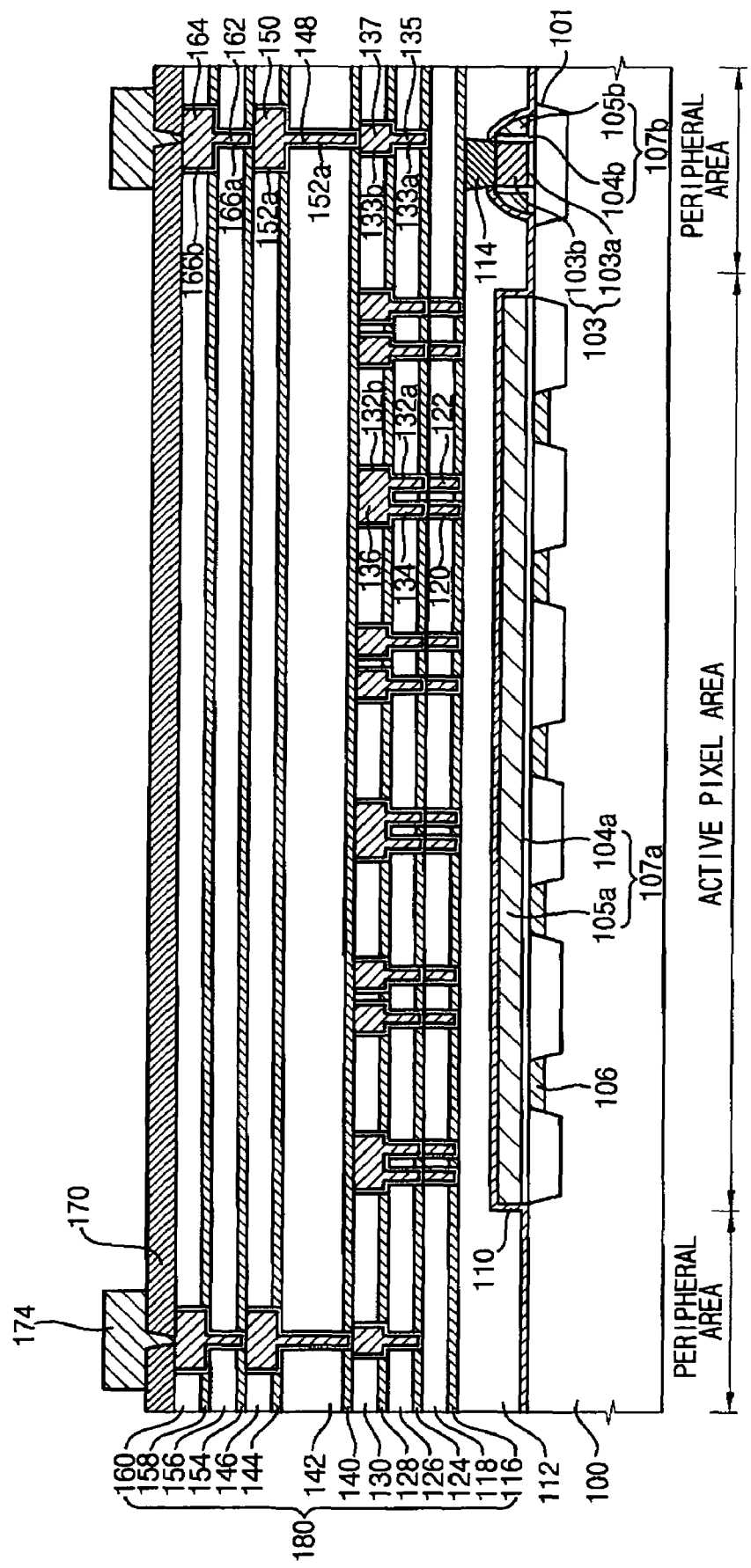

Referring to FIG. 8, a fourth insulation interlayer 142, a fifth etching stop layer 144 and a fifth insulation interlayer 146 are sequentially formed on the fourth etching stop layer 140.

The fifth insulation interlayer 146, the fifth etching stop layer 144, the fourth insulation interlayer 142 and the fourth etching stop layer 140 are partially etched away at the peripheral area of the substrate 100 to form a third contact hole (not shown) partially exposing the second peripheral subsidiary metal wiring 137.

Thereafter, the fifth insulation interlayer 146 and the fifth etching stop layer 144 are partially etched away to form a line-shaped third trench (not shown) that is connected at least one of the third contact holes. It will be understood that the third trench may be formed after the third contact hole is formed.

In the same process as described with reference to FIG. 7, a third barrier metal layer (not shown) is formed on a top surface of the fifth insulation interlayer 146, on the sidewalls of the third trench and the third contact hole and on the exposed surface of the second peripheral subsidiary metal wiring 137. A third copper layer is formed on the third barrier metal layer to a sufficient thickness to fill up the third trench and the third contact hole. Then, the third copper layer is planarized until the top surface of the fifth insulation interlayer 146, for example, by a CMP process. The third barrier metal layer only remains in the third contact hole to form a fourth barrier metal pattern 152a and also only remains in the third trench to form a fifth barrier metal pattern 152b. Further, the second copper layer only remains in the second contact hole defined by the fourth barrier metal pattern 152a to form a third contact plug 148 and only remains in the third trench defined by the fifth barrier metal pattern 152b to form a third subsidiary metal wiring 150.

A sixth etching stop layer 154 is formed on the fifth insulation interlayer 146 and the third subsidiary metal wiring 150.

A sixth insulation interlayer 156 including the fourth contact plug 164 and a seventh insulation interlayer 160 including the fourth subsidiary metal wiring 164 are sequentially formed on the sixth etching stop layer 154, for example, by repeatedly performing the same process as for the third contact plug 148 and the third subsidiary metal wiring 150. A seventh etching stop layer 158 is formed between the sixth insulation interlayer 156 and the seventh insulation interlayer 160.

In addition, a sixth barrier metal pattern 166a is formed around the fourth contact plug 162 in a fourth contact hole of the sixth insulation interlayer 156, and a seventh barrier metal pattern 166b is formed around the fourth subsidiary metal wiring 164 in a fourth trench of the seventh insulation interlayer 160.

An eighth etching stop layer (not shown) is formed on the fourth subsidiary metal wiring 164 and the seventh insulation interlayer 160.

As a result, the second metal wiring structure is formed to have a preliminary interlayer structure 180 including the first through seventh insulation interlayers and the second peripheral contact plug 135 and peripheral subsidiary metal wiring 137, the third peripheral contact plug 148 and peripheral subsidiary metal wiring 150 and the fourth peripheral contact plug and peripheral subsidiary metal wiring 162 and 164 that are formed in the preliminary interlayer structure 180 in the peripheral area of the substrate 100.

A passivation layer 170 may be further formed on the eighth etching stop layer or on the preliminary interlayer structure 180, so that underlying layers under the passivation layer 170 may be protected from impurities. In an exemplary embodiment of the present invention, the passivation layer 170 may comprise silicon oxide or silicon nitride that is deposited onto the eighth etching stop layer or on the preliminary interlayer structure 180.

When the passivation layer 170 is a single layer comprising silicon nitride, the eighth etching stop layer does not need to be formed on the fourth subsidiary metal wiring 164 and the seventh insulation interlayer 160, because the eighth etching stop layer comprises the same material as the passivation layer 170.

The passivation layer 170 is partially etched away to form a pad contact hole (not shown) partially exposing the fourth subsidiary metal wiring 164. A pad electrode layer is formed on the passivation layer 170 to a sufficient thickness to fill up the pad contact hole by depositing a conductive material onto the passivation layer 170. The pad electrode layer is patterned by a photolithography process to form a pad electrode 174. For example, the pad electrode may comprise aluminum.

Figure 9:
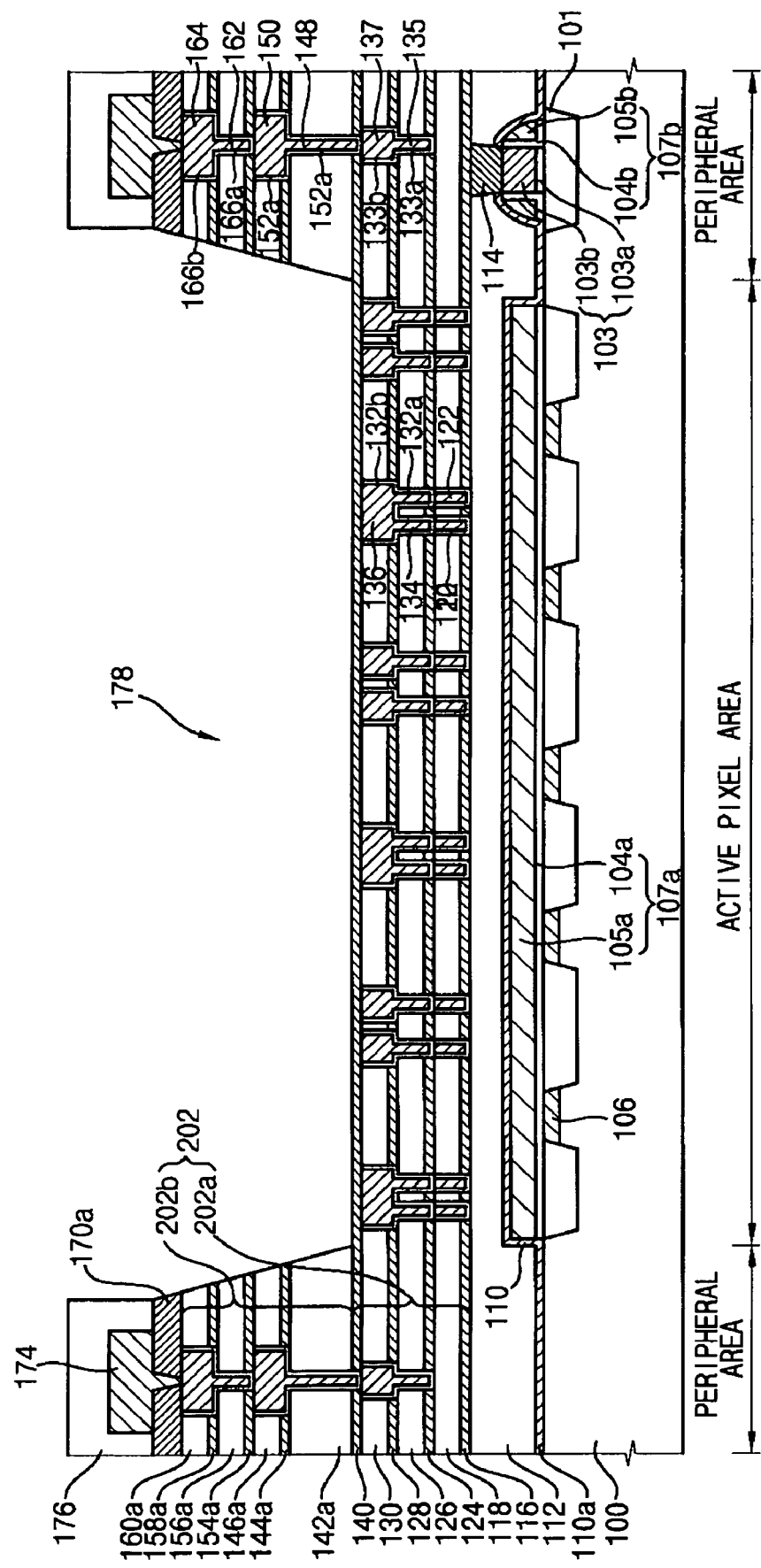
Figure 10:
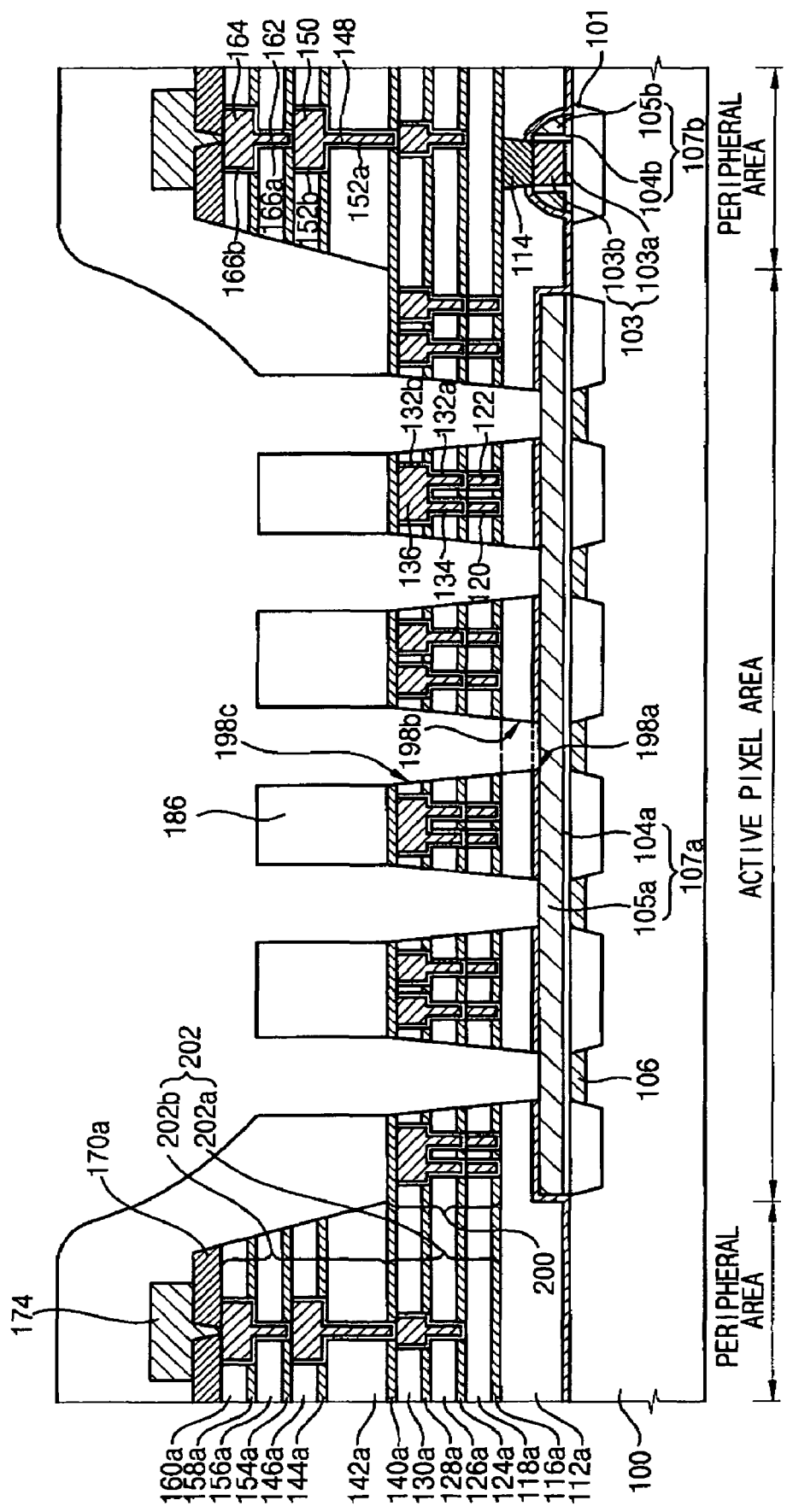

Referring to FIG. 9, a third photoresist layer (not shown) is formed on the passivation layer 170 to a sufficient thickness to cover the pad electrode 174 and is patterned by a photolithography process to form a third photoresist pattern 176 wherein the active pixel area of the substrate is exposed and the peripheral area of the substrate 100 is covered. The preliminary interlayer structure 180 in the active pixel area is partially etched away using the third photoresist pattern as an etching mask on the condition that the first metal wiring structure is not exposed, thereby forming a recess portion 178 in the active pixel area of the substrate 100 and forming the second insulation interlayer structure 202 in the peripheral area of the substrate 100. In an exemplary embodiment of the present invention, the fourth etching stop layer 140 is exposed through the recess portion 178 in the active pixel area of the substrate 100. The passivation layer 170 is partially removed from the substrate 100 by the above etching process, and the remaining passivation layer is designated as a reference numeral 170a in FIG. 9. The third photoresist pattern 176 is then removed from the remaining passivation layer 170a Referring to FIG. 10, a fourth photoresist layer (not shown) is formed on the remaining passivation layer 170a including the second insulation interlayer structure 202 and the exposed fourth etching stop layer 140 and is patterned by a photolithography process to form a fourth photoresist pattern 186 wherein the fourth etching stop layer 140 is exposed corresponding to the photodiode 106.

Then, the fourth etching stop layer 140 and underlying layers under the fourth etching stop layer 140 are etched away using the fourth photoresist pattern 186 as an etching mask until a top surface of the lower insulation layer 112 is exposed, thereby forming a first insulation interlayer structure 200 including a third opening 198c through which the top surface of the lower insulation layer 112 is exposed.

The lower insulation layer 112 is continuously etched away using the fourth photoresist pattern 186 as an etching mask, thereby forming a lower insulation pattern 112a including a second opening 198b through which a top surface of the anti-reflection layer 110 is exposed. The second opening 198b is connected with the third opening 198c, so that the top surface of the anti-reflection layer is partially exposed through the third and second openings 198c and 198b. The anti-reflection layer 110 is etched away using the fourth photoresist pattern 186 as an etching mask, thereby forming an anti-reflection pattern 110a including a first opening 198a partially exposing the silicon nitride pattern 105a. The first opening 198a is connected with the second opening 198b, so that the silicon nitride pattern 105a is exposed to surroundings through the first, second and third openings 198a, 198b and 198c.

Although the above-described exemplary embodiment discloses that the silicon nitride pattern 105a is partially etched away and is partially exposed through the first opening 198a, the silicon nitride pattern 105a may be completely removed from the silicon oxide pattern 104a, so that the silicon oxide pattern 104a may be exposed through the first opening 198a. In an exemplary embodiment of the present invention, the silicon nitride pattern 105a is formed to a thickness of about 400 Å or less.

As a result, the active pixel area of the substrate 100 is covered with the anti-reflection pattern 110a except some portions exposed through the first, second and third openings 198a, 198b and 198c through which light passes to the photodiode 106. When first light passing into a first photodiode is refracted into a second photodiode adjacent to the first photodiode, the anti-reflection pattern 110a prevents the first light from being incident to the second photodiode, irregardless of how close to each other the first and second photodiodes are, preventing crosstalk between adjacent photodiodes and reducing failures of the image sensor due to the crosstalk.

The anti-reflection layer 110 is partially removed from the silicon nitride pattern 105a simultaneously with the first, second and third openings 198a, 198b and 198c through which light passes to the photodiode 106, such that the anti-reflection pattern 110a is formed without an additional photolithography process. In exemplary embodiments of the present invention, no additional photolithography process is required for removing the anti-reflection layer in the active pixel area of the substrate 100 after formation of the anti-reflection layer, so that additional processes such as a coating process of a photoresist film, an exposing process of the photoresist film to light and a developing process of the exposed photoresist film are not needed, reducing manufacturing time and cost of the image sensor.

Thereafter, the fourth photoresist pattern is removed from the remaining passivation layer 170a and the fourth etching stop pattern 140a, for example, by an ashing process and a strip process.

Referring to FIG. 1, a first transparent insulation layer (not shown) is formed on the first insulation interlayer structure 200 and the second insulation interlayer structure 202 to a sufficient thickness to fill up the first, second and third openings 198a, 198b and 198c by a deposition process. In an exemplary embodiment of the present invention, the first transparent layer comprises, for example a resin or a flowable oxide, and has a refractive index that is higher than that of the insulation interlayer patterns of the first insulation interlayer structure 200. For example, when each of the insulation interlayer patterns comprises FSG of which the refractive index is about 1.4, the first transparent insulation layer comprises a material of which a refractive index is no less than about 1.4, for example, a material of the refractive index is about 1.5. In an exemplary embodiment of the present invention, the higher refractive index of the transparent material than the insulation interlayer patterns of the first insulation interlayer structure 200 prevents the light passing through the first, second and third openings 198a, 198b and 198c from leaking from the first, second and third openings 198a, 198b and 198c and from being incident onto an adjacent photodiode in a neighboring unit pixel, thereby preventing crosstalk between photodiodes adjacent to each other.

The first transparent insulation layer is then etched away until a top surface of the fourth etching stop pattern 140a is exposed and a top surface of the remaining passivation layer 170a is exposed, so that the first transparent insulation layer only remains in the first, second and third openings 198a, 198b and 198c, thereby forming a first transparent insulation pattern 188 in the active pixel area of the substrate 100.

A top surface of the first transparent insulation pattern 188 is coplanar with a top surface of a tube-shaped optical path to each unit pixel, so that the top surface of the first transparent insulation pattern 188 is a light incident face for each unit pixel of the image sensor.

A planarization layer (not shown) is formed on the first insulation interlayer structure 200, on the first transparent insulation pattern 188 and on the second insulation interlayer structure 202. The planarization layer comprises a transparent insulation material such as, for example, novolac resin, which may be used as a resin for a photoresist composition, and/or a flowable oxide.

The planarization layer is partially removed and is to be formed into a planarization pattern 191 on the first insulation interlayer structure 200 and on the first transparent insulation pattern 188 in the active pixel area of the substrate 100. In an exemplary embodiment of the present invention, the planarization pattern 191 is formed to a thickness of about 0.2 μm to about 0.6 μm.

A color filter 192 is formed on the planarization pattern 191. Blue, green and red filters are arranged in the color filter 192.

A second transparent insulation pattern 194 is formed on the color filter 192, and a micro lens 196 for focusing light into the photodiode 106 is formed on the second transparent insulation pattern 194, completing the CMOS image sensor. In an exemplary embodiment of the present invention, the micro lens 196 has a semi-sphere shape facing a top surface of the second transparent insulation pattern 194 and has a radius of about 0.2 μm to about 0.6 μm.

Exemplary Embodiment 2

Figure 11:
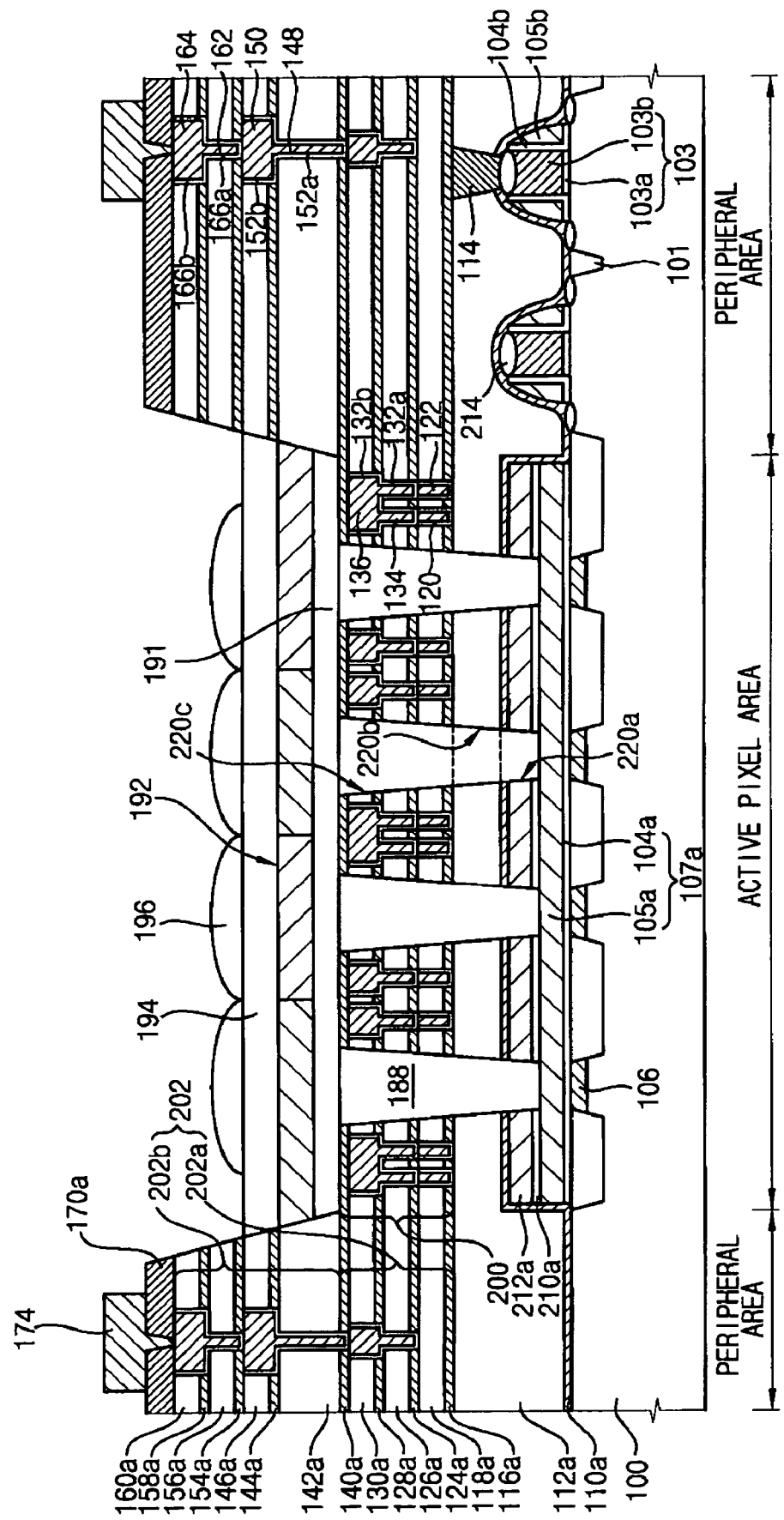
FIG. 11 is a cross-sectional view illustrating an image sensor according to a second exemplary embodiment of the present invention.

FIG. 11 is a cross-sectional view illustrating an image sensor according to a second exemplary embodiment of the present invention.

The image sensor according to the second exemplary is the same as in Exemplary Embodiment 1 except that a second silicon oxide pattern and a second silicon nitride pattern are formed on the silicon nitride pattern as a silicidation prevention pattern.

Referring to FIG. 11, a second silicon oxide pattern 210a and a second silicon nitride pattern 212a are formed on the silicon nitride pattern as a silicidation stop pattern. A metal silicide layer 214 is formed on a gate electrode and source/drain regions in the peripheral area of the substrate 100.

The silicon nitride pattern 105a is exposed through the second silicon oxide pattern 210a and the second silicon nitride pattern 212a corresponding to the photodiode 106. Some of the transistors in the peripheral area of the substrate 100 on which the metal silicide layer 214 is formed are exposed through the second silicon oxide pattern 210a and the second silicon nitride pattern 212a.

Other elements of the image sensor of the embodiment Exemplary Embodiment 2 are the same as in Exemplary Embodiment 1. Like reference numerals denote the same elements of the imager sensor in Exemplary Embodiment 1, and further description is omitted in the interests of clarity.

FIGS. 12 to 15 are cross-sectional views illustrating processing steps for a method of forming the image sensor shown in FIG. 11. The method of forming an image sensor in Exemplary Embodiment 2 is the same as described in Exemplary Embodiment 1 except that the second silicon oxide pattern and the second silicon nitride pattern are formed on a first silicon nitride pattern 105a and a metal silicide layer is formed on a transistor. Hereinafter, the like reference numerals denote the same elements of the imager sensor in Exemplary Embodiment 1, and further description is omitted in the interests of clarity.

In the same process as described with reference to FIGS. 3 and 4, the first and second spacers 104b and 105b are formed at sidewalls of the gate electrode 103b, and a first silicon oxide pattern 104a and a first silicon nitride pattern 105a are formed in the active pixel area of the substrate 100. For example, the photodiodes 106 in the active pixel area are covered with the first silicon oxide pattern 104a and the first silicon nitride pattern 105a.

Figure 12:
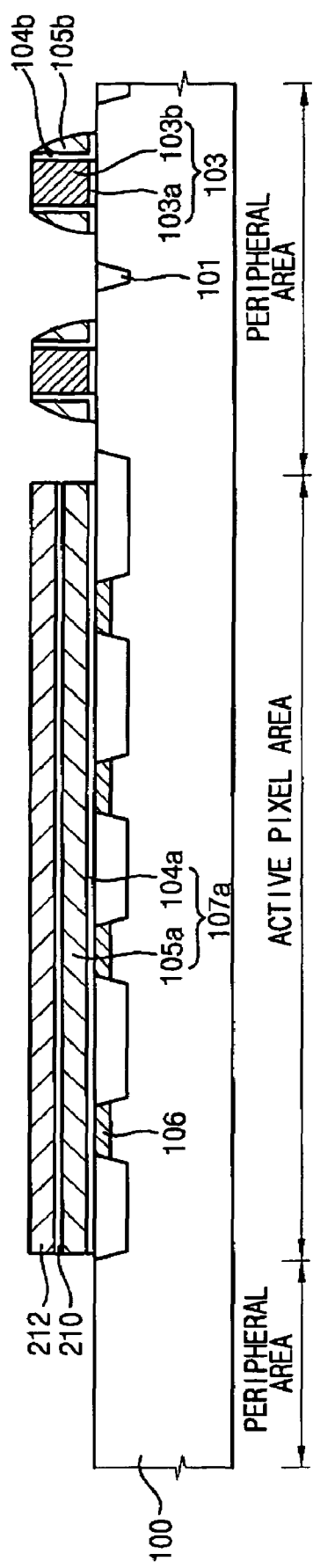
FIGS. 12 to 15 are cross-sectional view illustrating processing steps for a method of forming the image sensor shown in FIG. 11.

Referring to FIG. 12, a second silicon oxide layer (not shown) and a second silicon nitride layer (not shown) are sequentially formed on the first silicon nitride pattern 105a, on the second spacer 105b and on a surface of the substrate 100.

A photoresist pattern (not shown) is formed on the second nitride layer so as to partially form a metal silicide layer, wherein some of the gate electrodes and source/drain regions in the peripheral area of the substrate 100 are exposed through the photoresist pattern. A metal silicide process is performed on the exposed gate electrodes and source/drain regions in a subsequent process.

The second silicon nitride layer and the second silicon oxide layer are partially and sequentially etched away using the photoresist pattern as an etching mask, thereby forming a preliminary second silicon oxide pattern 210 and a preliminary second silicon nitride pattern 212 on the first silicon nitride pattern 105a for preventing a metal silicidation process against the first silicon nitride pattern 105a.

A gate electrode and source/drain regions of some transistors in the peripheral area of the substrate 100 are exposed through the preliminary second silicon oxide pattern 210 and the preliminary second silicon nitride pattern 212. Thereafter, the photoresist pattern is removed from the preliminary second silicon nitride pattern 212, for example, by an ashing process and a strip process.

Figure 13:
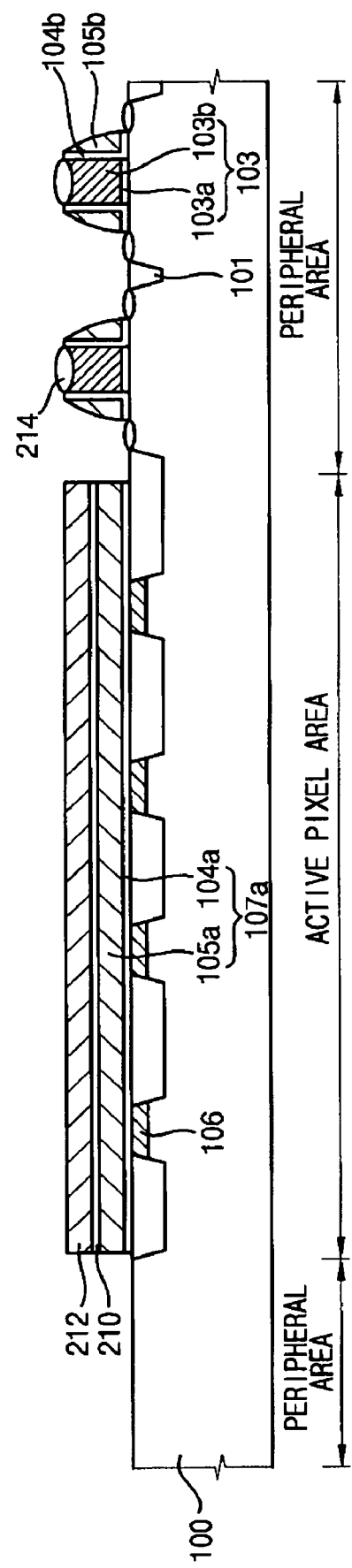

Referring to FIG. 13, a metal layer (not shown) is formed on the preliminary second silicon nitride pattern 212 and the transistors exposed through the preliminary second silicon nitride pattern 212, and a heat treatment is performed on the metal layer for a metal silicidation process in which the metal is reacted with silicon (Si), so that a metal silicide layer 214 is formed on the gate electrode and source/rain regions of the exposed transistors in the peripheral area of the substrate 100.

Thereafter, a residual metal layer that is not reacted with silicon (Si) is removed from the preliminary second silicon nitride pattern 212.

Figure 14:
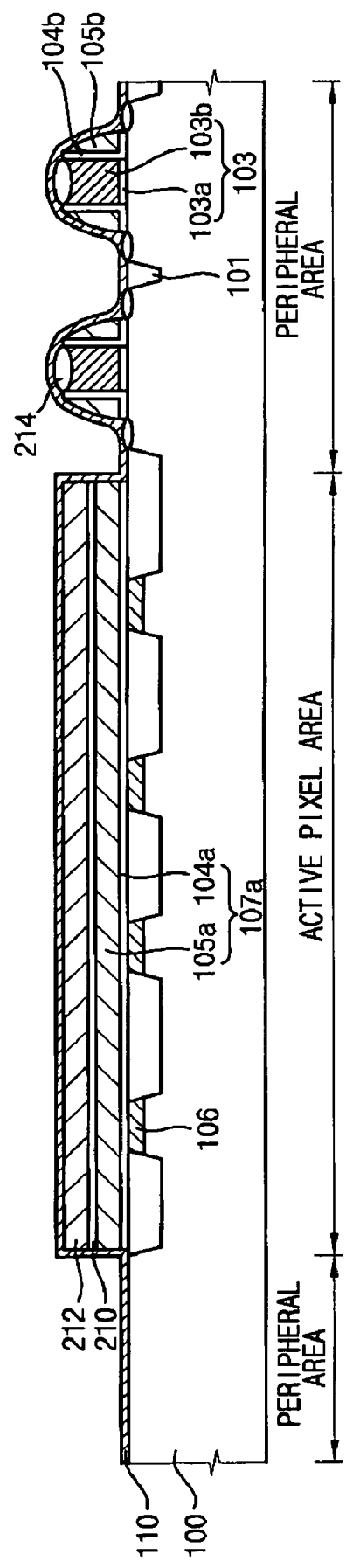

Referring to FIG. 14, the anti-reflection layer is formed on the preliminary second silicon nitride pattern 212 and on the surface of the substrate 100 by any suitable deposition process. The anti-reflection layer 110 may comprise, for example, silicon oxynitride or silicon nitride. In an exemplary embodiment of the present invention, the anti-reflection layer comprises silicon oxynitride.

The anti-reflection layer prevents a diffused reflection in a subsequent photo process and functions as an etching stop layer in a subsequent etching process.

Figure 15:
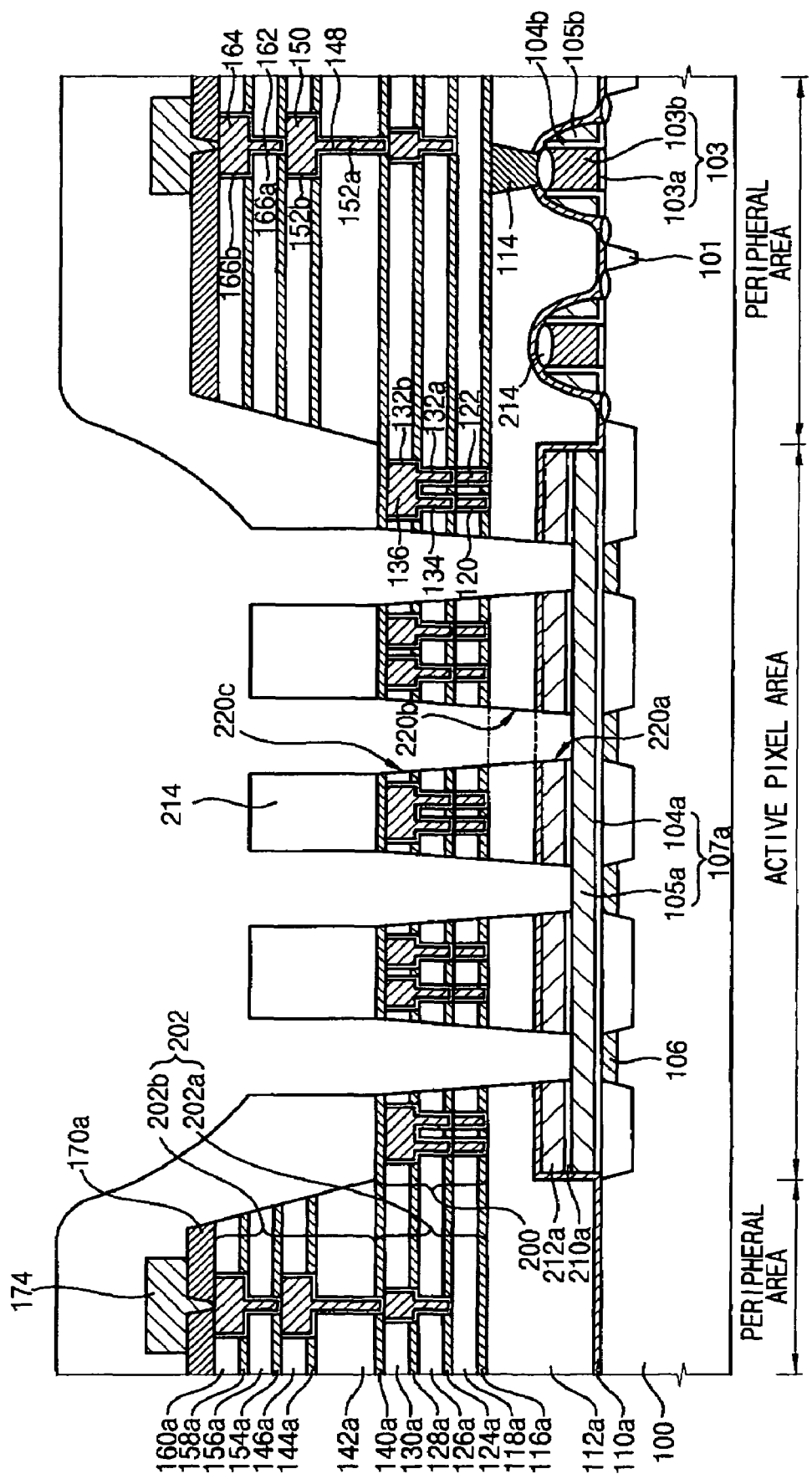

Referring to FIG. 15, the second insulation interlayer structure 202 and the second metal wiring structure are formed on the anti-reflection layer 110 in the peripheral area of the substrate 100, for example, in the same process as described with reference to FIGS. 6 to 9. Further, a first preliminary insulation interlayer structure and a first metal wiring structure are formed on the anti-reflection layer 110 in the active pixel area of the substrate 100. A top surface of the preliminary first insulation interlayer structure is lower than that of the second insulation interlayer structure 202.

A photoresist pattern 214 is formed on the fourth etching stop layer 140 and the second insulation interlayer structure 202, so that the first preliminary insulation interlayer structure under the fourth etching stop layer 140 is exposed corresponding to the photodiode 106 through the photoresist pattern 214.

Then, the first preliminary insulation interlayer structure is partially etched away using the photoresist pattern 214 as an etching mask until a top surface of the lower insulation layer 112 is exposed, thereby forming a first insulation interlayer structure 200 including a third opening 220c through which the top surface of the lower insulation layer 112 is exposed.

The lower insulation layer 112 is etched away using the photoresist pattern 214 as an etching mask, thereby forming a lower insulation pattern 112a including a second opening 220b through which a top surface of the anti-reflection layer 110 is exposed. The second opening 220b is connected with the third opening 220c, so that the top surface of the anti-reflection layer 110 is partially exposed through the third and second openings 220c and 220b. The anti-reflection layer 110, the second preliminary silicon nitride pattern 212 and the second preliminary silicon oxide pattern 210 are sequentially etched away using the photoresist pattern 214 as an etching mask, thereby forming an anti-reflection pattern 110a, a second silicon nitride pattern 212a and a second silicon oxide pattern 210a including a first opening 220a through which the first silicon nitride pattern 105a is partially exposed. The first opening 220a is connected with the second opening 220b, so that the first silicon nitride pattern 105a is exposed through the first, second and third openings 220a, 220b and 220c.

Although in the above-described exemplarily embodiment the first silicon nitride pattern 105a is partially etched away and is partially exposed through the first opening 220a, it will be understood that the first silicon nitride pattern 105a may be completely removed from the first silicon oxide pattern 104a, so that the first silicon oxide pattern 104a may be exposed through the first opening 220a. In an exemplary embodiment of the present invention, the first silicon nitride pattern 105a is formed to a thickness of about 400 Å or less.

The first transparent insulation pattern 188 is formed in the first, second and third openings 220a, 220b and 220c, for example, in the same process as in Exemplary Embodiment 1. The planarization layer 191, the color filter 192 and the micro lens 196 are formed in the active pixel area of the substrate 100, completing the CMOS image sensor shown in FIG. 11.

Exemplary Embodiment 3

Figure 16:
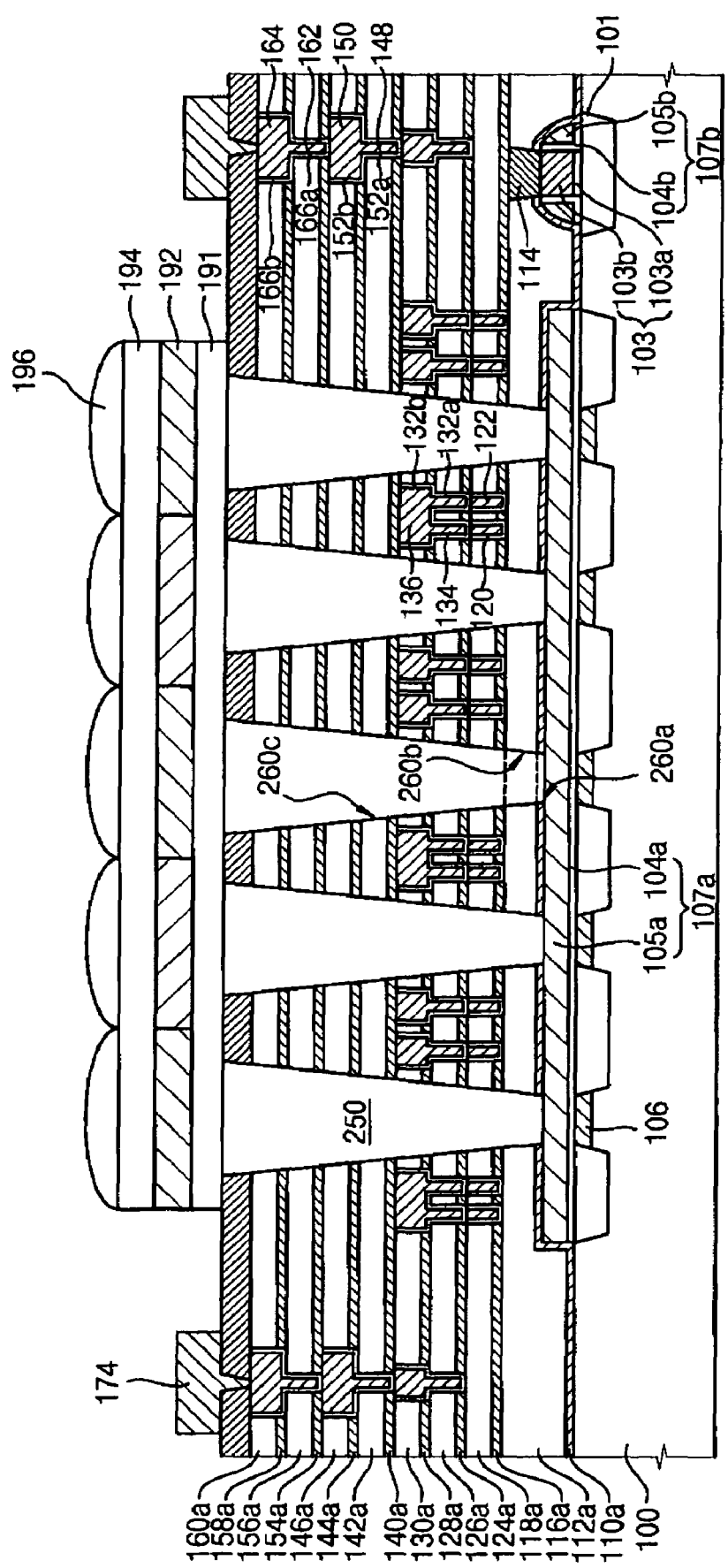
FIG. 16 is a cross-sectional view illustrating an image sensor according to a third exemplary embodiment of the present embodiment.

FIG. 16 is a cross-sectional view illustrating an image sensor according to a third exemplary embodiment of the present invention.

The image sensor according to the second exemplary embodiment is the same as in Exemplary Embodiment 1 except that no step difference is formed between the peripheral area and the active pixel area of the substrate.

Referring to FIG. 16, the same number of an insulation interlayer and an etching stop layer is formed both in the active pixel area and in the peripheral area of the substrate 100. The insulation interlayer and the etching stop layer in the active pixel area extends to the peripheral area of the substrate. No recess portion is formed in the active pixel area of the substrate 100, so that a top surface of the active pixel area is the same as that of the peripheral area, and no difference step is formed between the active pixel area and the peripheral area of the substrate 100.

Then, each insulation interlayer, the anti-reflection layer and each insulation pattern in the active pixel area of the substrate 100 are partially etched away corresponding to the photodiode 106, thereby forming first, second and third openings 260a, 260b and 260c that are connected in series with one another. A transparent insulation pattern 250 is formed in the first, second and third openings 260a, 260b and 260c.

Figure 17:
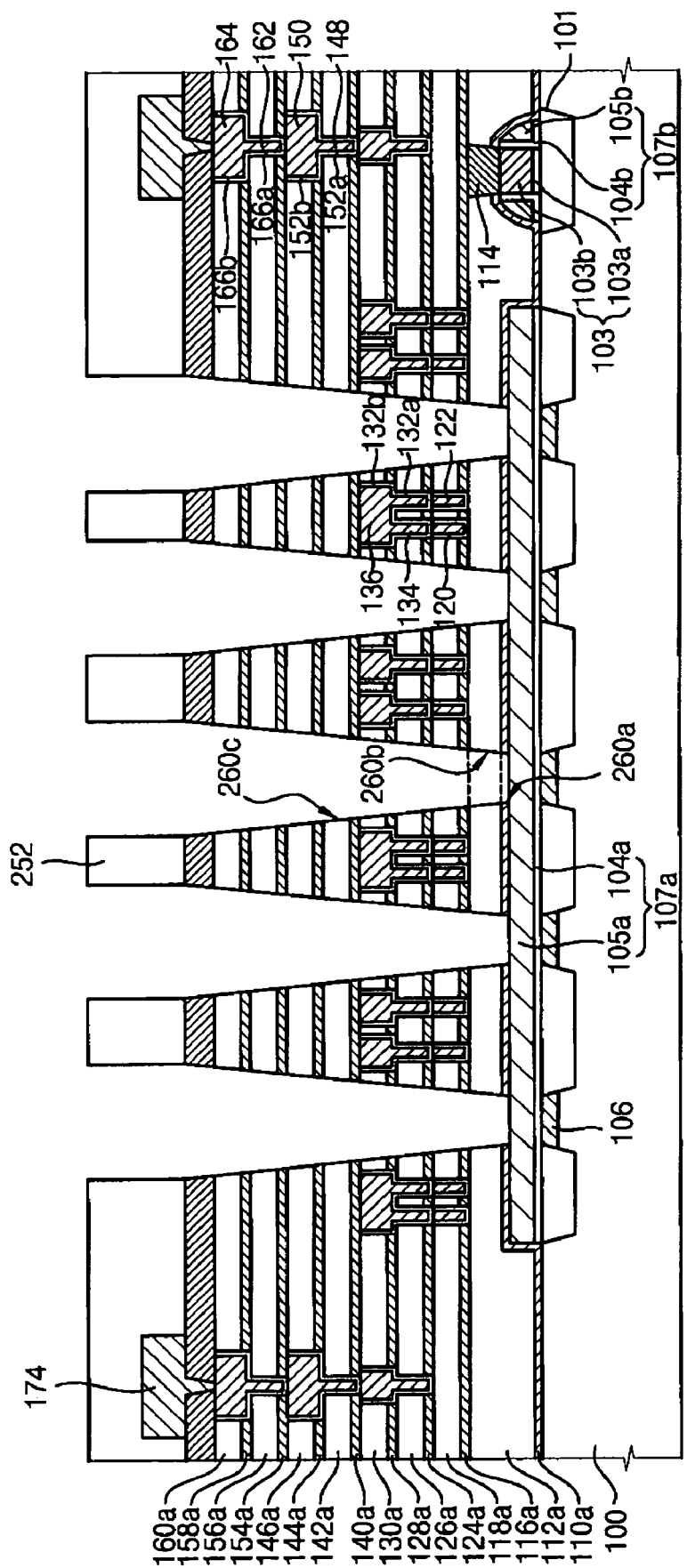
FIG. 17 is a cross-sectional view illustrating a processing step for a method of forming the image sensor shown in FIG. 16.

Other elements of the image sensor of the present embodiment are the same as in Embodiment 1. Like reference numerals denote the same elements of the imager sensor in Exemplary Embodiment 1, and further description is omitted in the interests of clarity and simplicity FIG. 17 is a cross-sectional view illustrating a processing step for a method of forming the image sensor shown in FIG. 16. The method of forming an image sensor in Exemplary Embodiment 2 is the same as described in Exemplary Embodiment 1 except that the active pixel area of the substrate is not etched and no step difference is formed between the active pixel area and the peripheral area of the substrate. Hereinafter, the same reference numerals denote the same elements of the imager sensor in Embodiment 1, and the detailed descriptions on the same elements will be omitted.

Referring to FIG. 17, a preliminary insulation interlayer structure 180, a first metal wiring structure and a second metal wiring structure are formed on a substrate 100 in the same process as described with reference to FIGS. 3 to 8. A passivation layer 170 and a pad electrode 174 are formed on the substrate 100 including the preliminary insulation interlayer structure 180 and the first and second metal wiring structures. A photoresist pattern 252 is formed on the passivation layer 170 and the pad electrode 174, so that the passivation layer over the photodiode 106 is exposed through the photoresist pattern 252.

The preliminary insulation interlayer is partially etched away using the photoresist pattern 252 as an etching mask, thereby forming a first insulation interlayer structure including a third opening 260c through which the lower insulation layer 112 is exposed in the active area and forming a second insulation interlayer structure in the peripheral area of the substrate 100.

The lower insulation layer 112 is continuously etched away using the photoresist pattern 252 as an etching mask, thereby forming a lower insulation pattern 112a including a second opening 260b through which a top surface of the anti-reflection layer 110 is exposed. The second opening 260b is connected with the third opening 260c, so that the top surface of the anti-reflection layer 110 is partially exposed through the third and second openings 260c and 260b. The anti-reflection layer 110 is partially etched away using the photoresist pattern 252 as an etching mask, thereby forming an anti-reflection pattern 110a including a first opening 260a through which the silicon nitride pattern 105a is partially exposed. The first opening 260a is connected with the second opening 260b, so that the silicon nitride pattern 105a is exposed to surroundings through the first, second and third openings 260a, 260b and 260c.

Although in the above-described exemplarily embodiment the silicon nitride pattern 105a is partially etched away and is partially exposed through the first opening 260a, it will be understood that the silicon nitride pattern 105a may be completely removed from the silicon oxide pattern 104a, so that the silicon oxide pattern 104a may be exposed through the first opening 260a. In an exemplary embodiment of the present invention, the silicon nitride pattern 105a is formed to a thickness of about 400 Å or less.

Then, the first transparent insulation pattern 250 is formed in the first, second and third openings 260a, 260b and 260c, for example, in the same process as in Exemplary Embodiment 1. The planarization layer 191, the color filter 192 and the micro lens 196 are formed in the active pixel area of the substrate 100, completing the CMOS image sensor shown in FIG. 16.

According to exemplary embodiments of the present invention, a CMOS image sensor has good photosensitivity and minimal pixel crosstalk, reducing manufacturing cost and time for the CMOS image sensor.

Although the exemplary embodiments of the present invention have been described in detail with reference to the accompanying drawings for the purpose of illustration, it is to be understood that the that the inventive processes and apparatus are not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A method of manufacturing an image sensor, comprising:
    providing a substrate including a first area and a second area, wherein a photodiode is formed in the first area of the substrate and the second area surrounds the first area;
    forming an insulation pattern structure making contact with the photodiode in the first area of the substrate;
    forming an anti-reflection layer on the insulation pattern structure and on the substrate;
    forming a preliminary insulation interlayer structure having a plurality of insulation layers on the anti-reflection layer and on the substrate, the preliminary insulation interlayer structure including a first metal wiring structure in the first area and a second metal wiring structure in the second area, wherein a top surface of the second metal wiring structure in the second area is above that of the first metal wiring structure in the first area;
    forming a recess portion in the first area of the substrate by partially etching the preliminary insulation interlayer structure, to form a first preliminary insulation interlayer structure on the first area of the substrate and form a second preliminary insulation interlayer structure on the second area of the substrate;
    partially etching the first preliminary insulation interlayer structure and the anti-reflection layer corresponding to the photodiode, to form a first insulation interlayer structure having a second opening and form an anti-reflection pattern having a first opening connected to the second opening;

forming a transparent insulation pattern in the first and second openings;

forming a color filter on the transparent insulation pattern; and forming a micro lens on the color filter.

2. The method of claim 1, further comprising, after forming the second metal wiring structure, forming a pad electrode on the top surface of the second metal wiring structure, wherein signals from/to the image sensor transfer through the electrode pad.

3. The method of claim 1, wherein the first and second metal wiring structures comprise copper.

4. The method of claim 1, wherein forming the transparent insulation pattern includes:
  forming a transparent insulation layer on a bottom portion of the recess portion to a thickness to fill the first and second openings; and
  etching the transparent insulation layer until the bottom portion of the recess portion is exposed and the transparent insulation layer only remains in the first and second openings.

5. The method of claim 1, wherein forming the preliminary insulation interlayer structure includes:
  forming a first insulation interlayer on the substrate;
  forming a first subsidiary wiring in the first insulation interlayer, the first subsidiary wiring making contact with a first contact plug formed at a lower portion thereof;
  forming a second insulation interlayer on the first insulation interlayer and the first subsidiary wiring;
  forming second contact plugs making contact with the first subsidiary wiring in the second insulation interlayer;
  forming a third insulation interlayer on the second insulation interlayer and the second contact plugs;
  forming a second subsidiary wiring making contact with the second contact plug in the third insulation interlayer;
  forming a fourth insulation interlayer on the third insulation interlayer and the second subsidiary wiring;
  forming third contact plugs making contact with the second subsidiary wiring penetrating the fourth insulation interlayer in the second area of the substrate;
  forming a fifth insulation interlayer on the fourth insulation interlayer and the third contact plug;
  forming a third subsidiary wiring making contact with the third contact plug in the fifth insulation interlayer;
  forming a sixth insulation interlayer on the fifth insulation interlayer and the third subsidiary wiring;
  forming fourth contact plugs making contact with the third subsidiary wiring in the sixth insulation interlayer;
  forming a seventh insulation interlayer on the sixth insulation interlayer and the fourth contact plug; and
  forming a fourth subsidiary wiring making contact with the fourth contact plug in the seventh insulation interlayer.

6. The method of claim 5, further comprising forming first through sixth etching stop layers on each boundary surface of the first through seventh insulation interlayers, the etching stop layer comprising a non-transparent material.

7. The method of claim 1, further comprising, prior to forming the insulation pattern structure, forming a transistor on the substrate.

8. The method of claim 7, wherein forming the insulation pattern structure includes:
  sequentially forming a silicon oxide layer and a silicon nitride layer on the substrate;
  forming a photoresist pattern on the silicon nitride layer, the first area in which the photodiode is formed is covered with the photoresist pattern and the second area is exposed through the photoresist pattern; and
  anisotropically etching the silicon nitride layer and the silicon oxide layer using the photoresist pattern as an etching mask.

9. The method of claim 8, wherein a first spacer comprising silicon oxide and a second spacer comprising silicon nitride are formed on a sidewall of a gate electrode of the transistor in the anisotropic etching process.

* * * * *